United States Patent
Tanaka et al.

(10) Patent No.: US 7,568,084 B2
(45) Date of Patent: Jul. 28, 2009

(54) SEMICONDUCTOR INTEGRATED CIRCUIT INCLUDING MULTIPLE BASIC CELLS FORMED IN ARRAYS

(75) Inventors: Hiroshi Tanaka, Tokyo (JP); Yohei Akita, Tokyo (JP); Tetsuro Honmura, Sagamihara (JP); Fumio Arakawa, Tokyo (JP); Takanobu Tsunoda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 32 days.

(21) Appl. No.: 10/886,616

(22) Filed: Jul. 9, 2004

(65) Prior Publication Data

US 2005/0015572 A1 Jan. 20, 2005

(30) Foreign Application Priority Data

Jul. 9, 2003 (JP) ............................. 2003-194013
Dec. 8, 2003 (JP) ............................. 2003-408411

(51) Int. Cl.
*G06F 15/00* (2006.01)

(52) U.S. Cl. .......................................... 712/15; 712/10

(58) Field of Classification Search .................. 712/15, 712/10
See application file for complete search history.

(56) References Cited

U.S. PATENT DOCUMENTS

| | | | | |
|---|---|---|---|---|
| 4,992,933 A | * | 2/1991 | Taylor | ........................ 712/22 |
| 5,915,123 A | * | 6/1999 | Mirsky et al. | ................. 712/16 |
| 5,956,518 A | * | 9/1999 | DeHon et al. | ................. 712/15 |
| 6,883,084 B1 | * | 4/2005 | Donohoe | ........................ 712/1 |
| 7,191,312 B2 | | 3/2007 | Ikeda et al. | |
| 2001/0035772 A1 | | 11/2001 | Marshall et al. | |

FOREIGN PATENT DOCUMENTS

| | | |
|---|---|---|
| JP | 62-180456 | 8/1987 |
| WO | WO 94/10754 | 5/1994 |
| WO | WO 02/095946 | 11/2002 |

OTHER PUBLICATIONS

Sima et al.; "Advanced Computer Architectures: A Design Space Approach"; 1997.*
Reddaway; "DAP—A Distributed Array Processor"; 1973; ACM.*

* cited by examiner

*Primary Examiner*—Niketa I Patel
*Assistant Examiner*—Benjamin P Geib
(74) *Attorney, Agent, or Firm*—Antonelli, Terry, Stout & Kraus, LLP.

(57) ABSTRACT

A basic cell capable of a fixed operating frequency regardless of the configuration information, which is also capable of effectively utilizing the arithmetic logic circuit within the cell in a LSI semiconductor integrated circuit, is capable of dynamic changes in configuration information. The circuit has an input switch ISW connected to multiple data input nodes, an output switch OSW connected to multiple data output nodes, a first data path containing an arithmetic logic circuit ALU and a result storage flip-flop CFF0 between the input switch ISW and output switch OSW. The second data path containing a data transfer flip-flop between an input switch ISW and an output switch OSW, and the result storage flip-flop CFF stores the calculated result data from the arithmetic logic circuit ALU, and the data transfer flip-flop holds data input from any of the multiple data input nodes.

8 Claims, 31 Drawing Sheets

AOSW

| ALU No. | 1 | 2 | 3 | 4 | 5 |
|---|---|---|---|---|---|
| PRIOR ART | | (Op. ⇒ DTr.)/cycle | | | Op./cycle |
| FIRST EMBODIMENT | Op./cycle | DTr./cycle | DTr./cycle | DTr./cycle | Op./cycle |
| SECOND EMBODIMENT | Op./cycle | | DTr./cycle | | Op./cycle |

SEMICONDUCTOR INTEGRATED CIRCUIT INCLUDING MULTIPLE BASIC CELLS FORMED IN ARRAYS

CLAIM OF PRIORITY

The present application claims priority from Japanese application JP 2003-194013, filed on Jul. 9, 2003, and Japanese application JP 2003-408411, filed on Dec. 8, 2003, the contents of which are hereby incorporated by reference into this application.

FIELD OF THE INVENTION

The present invention relates to a semiconductor integrated circuit, and it relates in particular to a two-dimensional array and a LSI device that are capable of effecting dynamic changes in configuration information, as well as to a basic cell structure forming an array.

BACKGROUND OF THE INVENTION

In recent years, the spread of information processing devices and their greater sophistication has brought about the appearance of different types of applications. These applications are mainly implemented with software by a CPU (central processing unit). However a portion of these applications require a higher level of processing capability than that of currently used general-purpose type processors. The processors also require a greater processing capacity. Currently, the rapid progress that has been made in semiconductor manufacturing technology has expanded the circuit scale on which LSI (large scale integration) circuits can be fabricated, creating a need for LSI devices that are capable of efficiently using circuits on a large scale.

An LSI device with a higher processing capacity, which is capable of efficiently using circuits on a large scale, while maintaining a general-purpose function, is disclosed in the below-listed Patent document 1. The operation of this LSI device is changed by altering the configuration information specifying how the hardware, typified by a FPGA (Field Programmable Gate Array), is structured. The prior technology consists of cell arrays, containing a wiring region, and logic cells. Each cell within the wiring layer region is connected by wiring connecting to adjacent cells and by long-range wiring connecting to cells in separate locations. This structure (configuration) makes it possible to select whether or not to connect a wire by way of a switch within the wiring region. An LSI device with this type of structure can perform different processing by changing the configuration information that determines the cell operation and the on-off switching wiring operation. Changing the configuration information according to the processing to be run makes it possible to provide a structure resembling dedicated hardware, and so it is capable of faster processing than general-purpose processors.

A technology called reconfigurable LSI, as disclosed in the below-listed Patent document 2, has also been the focus of much attention in recent years. In the above-mentioned FPGA technology, logic gates comprised, for example, of NAND and NOR circuits are formed in arrays and their connecting wires are switched (to operate the circuits). In reconfigurable LSI technology, however, the arithmetic units are formed in arrays instead of logic gates, and the arithmetic unit functions and the wiring among each arithmetic unit are switched by the configuration information.

[Patent document 1] International disclosure 10754/1994 pamphlet

[Patent document 2] US Patent laid-open No. 35772/2001

However, in the technology mentioned above, the cells within the wiring region are connected by long-range wiring connecting to cells at separated locations and by wiring connecting to adjacent cells. Also, the flip-flops that coordinate the timing at which data is input among the cells, in many cases, are formed at locations different from the regions comprised of logic gates. Therefore, the wiring length connecting between cells, or for connecting the flip-flops for adjusting the timing for transferring data, changes according to the configuration information. This fact signifies that the wiring length for transferring data in one clock cycle changes according to the configuration information. In other words, the maximum operating frequency of the LSI device is related to the wiring length along which data must be sent in one clock cycle so that the maximum operating frequency of the LSI will vary according to the configuration information. Therefore, the LSI operating frequency must be changed every time the configuration information is changed. Changing the operating frequency is not practical during actual operation, so that the circuits, in most cases, are operated at a lower operating frequency. The present inventors took notice of the fact that such techniques had a problem in that improving the maximum operating frequency of the chip is difficult because the length of the wiring between cells, or the length of the wiring to the flip-flops, changes.

SUMMARY OF THE INVENTION

A simple overview of the typical operation of the invention disclosed in this application will be described next. The circuit includes an input switch connected to multiple data input nodes, an output switch connected to multiple output nodes, a first data path containing a first data holding circuit and an arithmetic logic circuit between that input switch and that output switch, and a second data path containing a second data holding circuit between that input switch and that output switch. The first data holding circuit stores the calculated result data of the arithmetic logic circuit, and the second data holding circuit is structured to hold data input from any of the multiple data input nodes.

More preferably, the semiconductor integrated circuit further comprises a first memory for holding first input switch select information for setting the connection relation between the multiple data input nodes and the first data path and the second data path, and first arithmetic function information for setting functions of the arithmetic logic circuit. The first output switch select information is used for setting the connection relation between the multiple data output nodes for said output switch and the first data path and the second data path.

Even more preferably, the arithmetic logic circuit contains a first arithmetic circuit, and a second arithmetic circuit for performing calculations of a different type than the first arithmetic circuit, and it determines according to the first arithmetic function information whether to perform calculations using the first arithmetic circuit or the second arithmetic circuit.

The first data holding circuit and the second data holding circuit require one clock pulse to perform data transfer in one basic cell. The improvement of the present invention proposes a method for forming a path through the cell without going through the holding circuit during passage through the cell.

The present invention can provide a semiconductor integrated circuit that is capable of high-speed operation.

BRIEF DESCRIPTION OF THE DRAWINGS

FIG. 22 is a table comparing the prior technology, first embodiment, and second embodiment of the present invention;

DETAILED DESCRIPTION OF THE PREFERRED EMBODIMENTS

Figure 1:
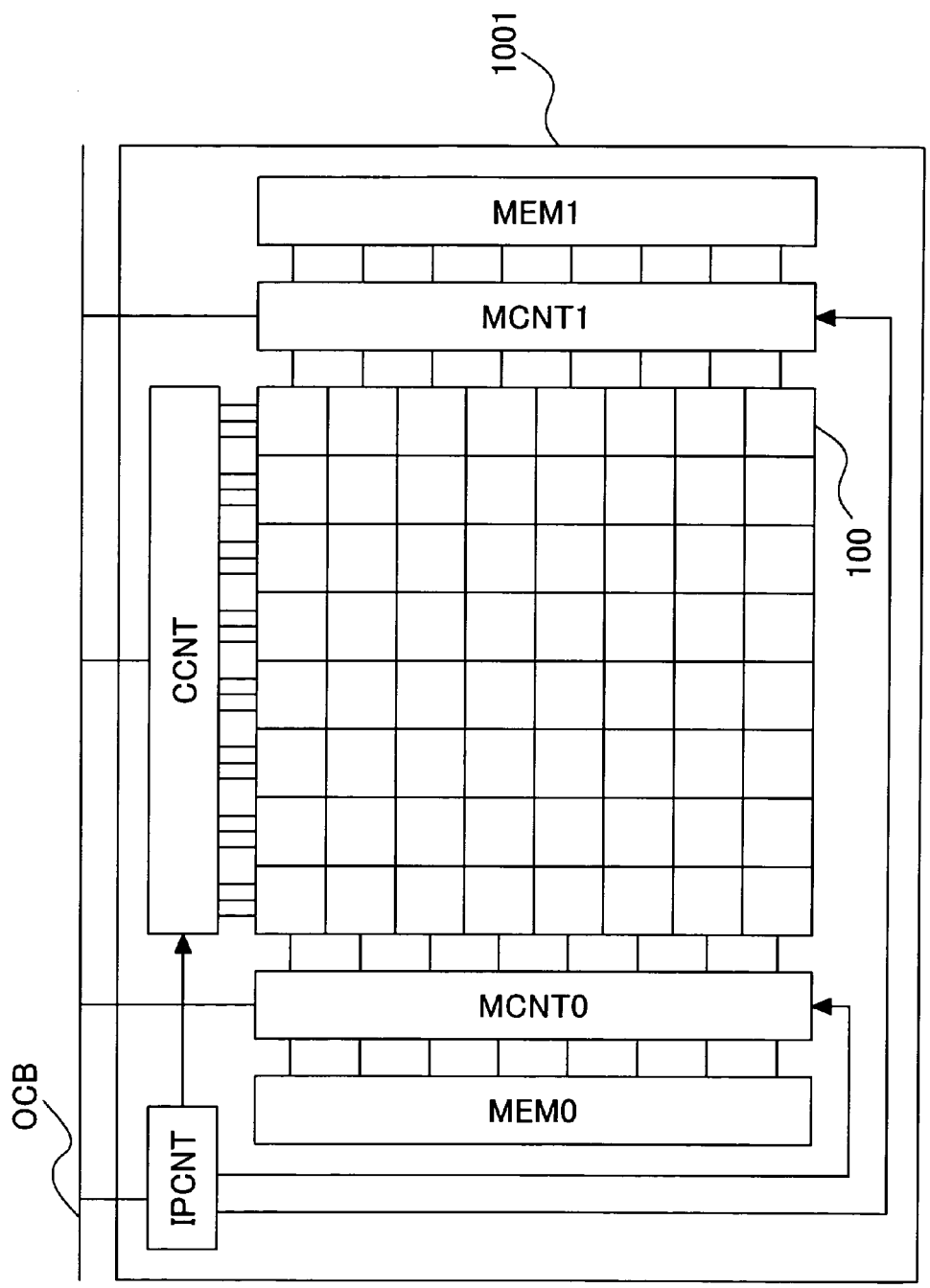
FIG. 1 is a block diagram of a semiconductor integrated circuit representing one embodiment of the present invention.

Typical embodiments of the present invention will be described with reference to the accompanying drawings. In the following description, elements identified with the same reference numeral or symbol represent the same or a similar item. Though there are no particular restrictions, the circuit devices comprising each block of an embodiment are formed on one semiconductor substrate, such as a monocrystalline silicon substitute, by known semiconductor integrated circuit technology, such as CMOS (complementary metal oxide semiconductor) or bipolar transistor technology.

FIG. 1 is a block diagram showing a circuit module of the system LSI representing an embodiment of the circuit block of the present invention. There are no particular restrictions, however this circuit module is a circuit whose configuration information can be dynamically changed. Each block shown in FIG. 1 is formed on one semiconductor substrate.

In the figure, the circuit module IP1001 is comprised of a cell array configured from 8 rows and 8 columns of basic cells 100, which serve as one unit, and a configuration controller CCNT, local memories MEM0 and MEM1, memory controllers MCNT0 and MCNT1, and an IP controller IPCNT are also provided. The configuration controller CCNT, memory controller MECNT, and the IP controller IPCNT are connected to an on-chip bus OCB. The on-chip bus OCB includes a data bus and address bus, and it is jointly connected with other circuit modules (not shown in the drawing).

The configuration controller CCNT controls the transfer of configuration information in the basic cells 100. The memory controller MCNT accepts instructions from the IP controller IPCNT, sends and receives data between the external memory and the local memory MEM, supplies data from the local memory MEM to the cell array, and stores data output from the cell array into the local memory MEM. The IP controller IPCNT runs the supplied program, controls the configuration controller CCNT, and controls the memory controller MCNT. Providing local memories MEM0, MEM1 makes it possible to reduce the exchange of data with the external memory when performing various processing, while changing the configuration information in the cell array section, and makes it easier for the cell array section to operate at high speed. The memory controllers MCTN0, MCTN1 and the configuration controllers CCNT are also capable of operating from instructions received directly from other control circuits (not shown in the drawing), such as the central processing units (CPU). However, the load on other control circuits, such as the CPU, can be alleviated by installing an IP controller IPCNT, and by controlling the memory controllers MCTN0, MCTN1 and the configuration controller CCNT inside the IP controller IPCNT. Further, after the processing arrives at the IP controller IPCNT, other control circuits, such as the CPU, are further capable of performing other processing in parallel, so that the overall processing performance of the system LSI device is improved.

1. First Embodiment

A first embodiment of the present invention, using flip-flops for data transfer as storage circuits within the basic cell, will be described next.

Figure 2:
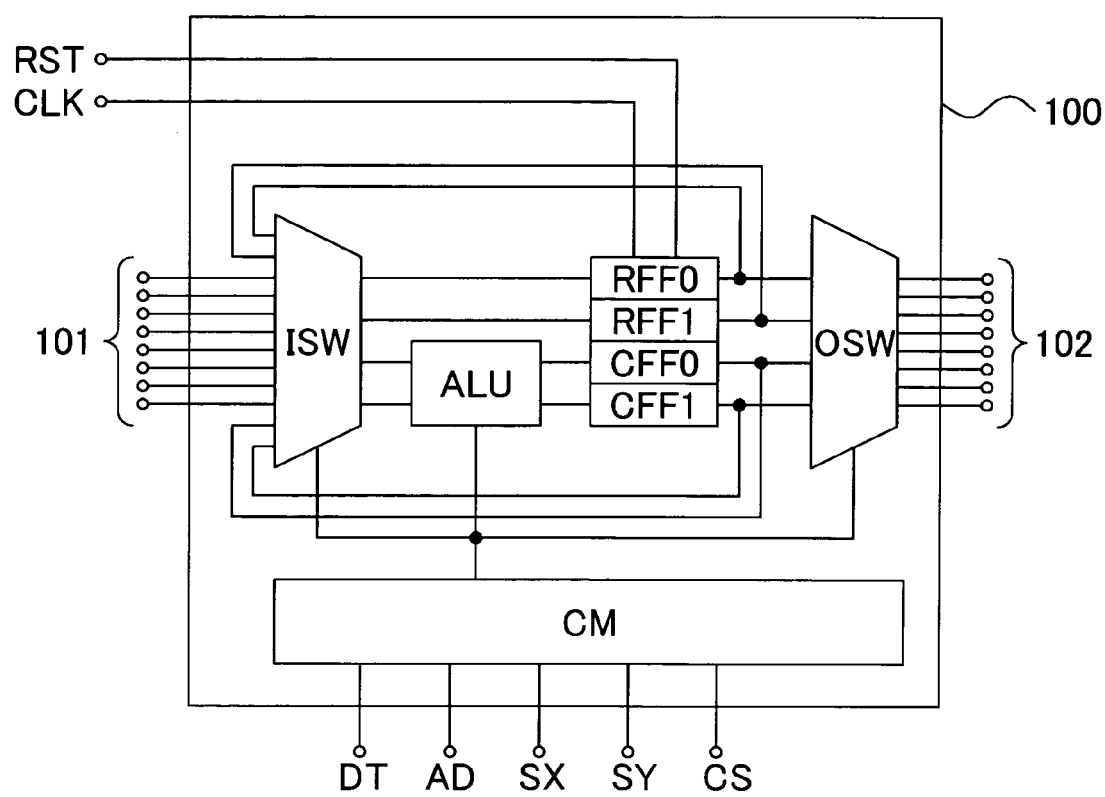
FIG. 2 is a block diagram showing the structure of a basic cell of the present invention.

FIG. 2 is a block diagram showing a first embodiment of the basic cell 100 in FIG. 1. The basic cell 100 is comprised of an input switch ISW, an output switch OSW, an arithmetic logic circuit ALU, flip-flops for calculated result data CFF, flip-flops for data transfer RFF, a configuration memory CM, a clock signal input line CLK, reset signal input line RST, an input line 101 that is connected to each of the multiple input nodes that receive data from adjacent cells, an output line 102 that is connected to each of the multiple data output nodes for outputting data to adjacent cells, a configuration information select signal line CS, a data input line DT for changing configuration information, cell select lines SX and SY, and an address input line AD for changing configuration information. The input data is transmitted by way of a first data path containing an arithmetic logic circuit ALU and a flip-flop for calculated result data CFF or by way of a second data path containing a flip-flop for data transfer RFF. The input line 101 from the adjacent cells and the output line 102 to the adjacent cells are each connected in one eight-bit bundle to the adjacent upper/lower/right/left cells in two lines each. The configuration information select signal line CS, the data input line DT for changing configuration information, the cell select lines SX and SY, and the address input line AD for changing configuration information are respectively connected to the configuration controller CCNT.

The structure in FIG. 2 is comprised of one arithmetic logic circuit ALU, two calculated result data flip-flops CFF (hereafter result storage flip-flops), and two flip-flops for data transfer RFF (hereafter data-transfer RFF flip-flops). However, the present invention is not limited to this number. The input line 101 from the adjacent cells and the output line 102 to the adjacent cells are connected with two lines each of 8-bit bundles to the left, right, upper and lower cells. However these lines are not limited to the number of bits and the adjacent cell connections per one line shown here.

The input of the input switch ISW is connected to the input lines 101 from the adjacent cells, to the output line from the result storage flip-flops CFF within its own cell, and to the data-transfer flip-flops RFF within its own cell. The ISW output is connected to the arithmetic logic circuit ALU and to the input lines of the data-transfer flip-flops RFF. During operation, the input switch ISW selects an input specified by the configuration memory CM from among the multiple input nodes, and the output is applied to the arithmetic logic circuit ALU or the data-transfer flip-flops RFF0, RFF1.

The input of the output switch OSW is connected to the outputs of the result storage flip-flop CFF and the data-transfer flip-flops RFF. The OSW output is connected to the output lines 102 connected to the adjacent cells. During operation, the output switch OSW selects an input specified by the configuration memory CM and outputs it to an output line 102. The arithmetic logic circuit ALU calculates the input data as specified by the configuration memory CM and outputs it.

The data-transfer flip-flops RFF and the result storage flip-flops CFF operate in synchronization with the clock signal CLK that is input to the cell, and they are reset by the reset signal RST. The reset signal RST is always input during chip start-up, and it is sometime input when a switch to a new configuration has been made.

The configuration memory CM receives configuration information from outside the cell, specifying the cell operation, and stores it within the memory device. There are no particular restrictions; however, the configuration information stored in the configuration memory CM contains arithmetic logic circuit ALU function information, input switch ISW and output switch OSW selection information, and constants used in the arithmetic logic circuit ALU. The switching of the internally stored configuration information and the operation of the input switch ISW and output switch OSW and the arithmetic logic circuit ALU are specified by the configuration select signal CS.

In a cell having this type of structure, one clock cycle is required for conveying data that is input from the adjacent cell input line 101 and sent once through the data-transfer flip-flops RFF or the result storage flip-flops CFF and is then output via the output switch OSW from the adjacent cell output line 102. In other words, after the clock signal transits from low level to high level, with one clock cycle being the time required for change from low level to high level, then after the data-transfer flip-flops RFF and the result storage Flip-flops CFF input data for processing to the basic cell 100, and when the clock signal CLK has changed from low level to high level, the data is then input, and data input to each of the flip-flops is held and output within one clock cycle. In contrast, the output of the data-transfer flip-flops RFF or the result storage flip-flops CFF is fed back to the input switch ISW; and, when it is once again output by way of the data-transfer flip-flops RFF or the result storage Flip-flops CFF and the output switch OSW to the adjacent cell output line 102, then two clock cycles are required. In other words, there are N number of data-transfer flip-flops RFF; and, when all of these flip-flops RFF are used, an output can be supplied from the cell after N clock cycles. By utilizing this function, synchronization with signals arriving from different paths and pipeline processing can be performed even when there is no long-distance wiring and even when using cells synchronized with the clock.

Figure 3:
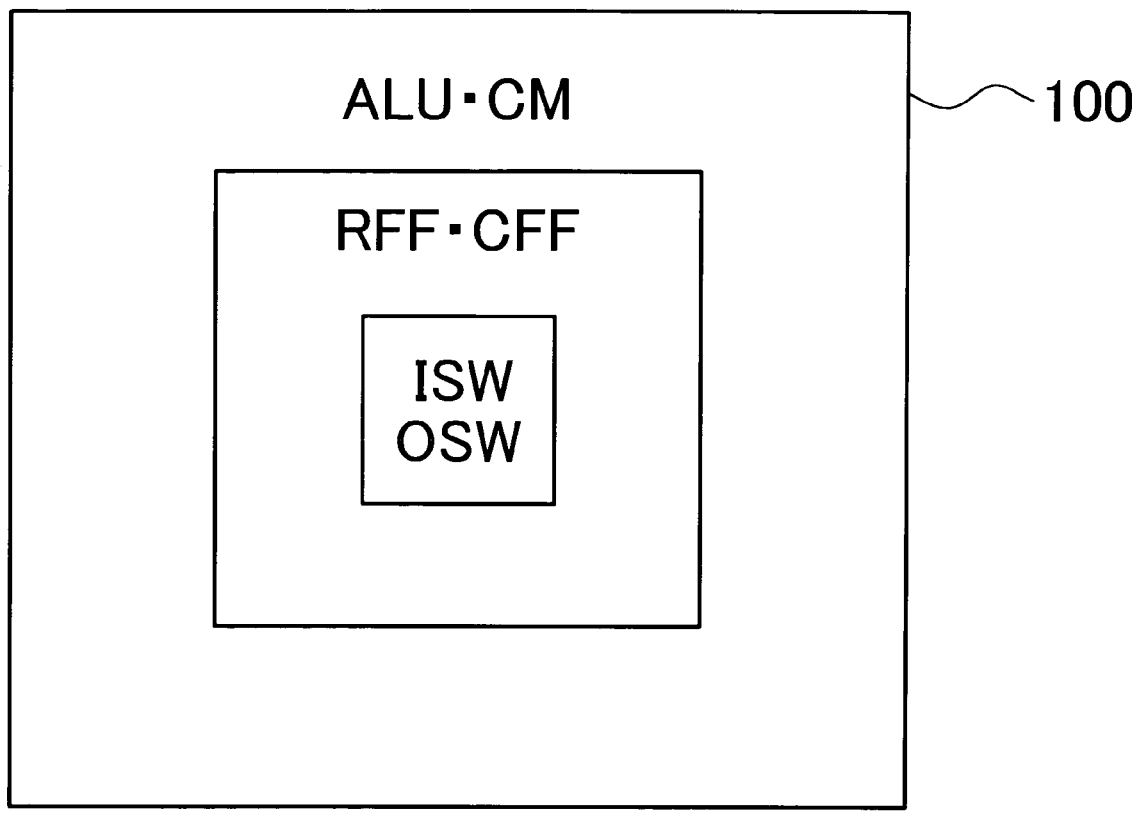
FIG. 3 is a diagram showing one arrangement for the blocks of a basic cell in FIG. 2.

FIG. 3 is a diagram showing one arrangement (layout plan) for the block circuits of the basic cell shown in FIG. 2. The input switch ISW and the output switch OSW are first of all formed in the center. Though there are no particular restrictions, the data-transfer flip-flops RFF and the result storage flip-flops CFF are formed in the vicinity of the input switch ISW and the output switch OSW. The arithmetic logic circuit ALU and the configuration memory CM are also formed in the vicinity of the ISW and OSW. By forming the input switch ISW and the output switch OSW in the center in this way, the length of the respective input lines 101 and output lines 102 connecting the upper/lower/right/left cells and the ISW and OSW can be made equal, the skew of the data signal can be reduced, and high speed operation can be achieved. There are no restrictions in this embodiment on the relative positions of the data-transfer flip-flops RFF or the result storage flip-flops CFF, the arithmetic logic circuit ALU, and the configuration memory CM. The data-transfer flip-flops RFF and the result storage flip-flops CFF can, for example, be formed on the external side, and the arithmetic logic circuit ALU and the configuration memory CM may be formed on the inner side.

Figure 4:
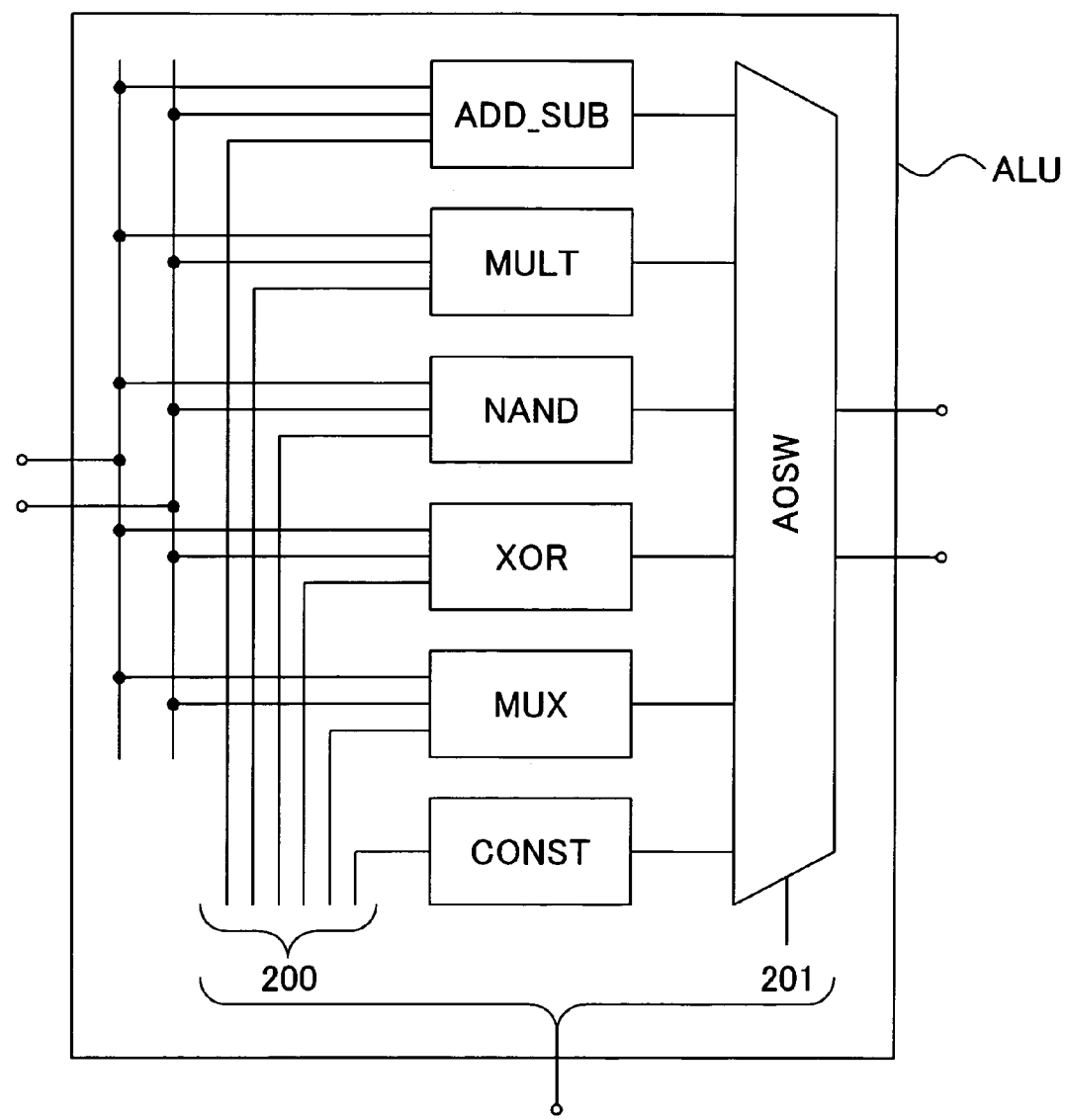
FIG. 4 is a block diagram showing the structure of the arithmetic logic circuit constituting the basic element of the basic cell.

FIG. 4 is a block diagram showing the structure of the arithmetic logic circuit ALU of the basic cell 100 of FIG. 2.

The arithmetic logic circuit ALU contains multiple different types of processing circuits for effecting computations, including an adder/subtracter ADD_SUB, a multiplier MULT, a negative AND (NAND) circuit, an exclusive OR (XOR) circuit, a multiplexer MUX, and a constant value output circuit CONST. The arithmetic logic circuit ALU further contains an output select switch AOSW, an instruction word set line 200 and an output select switch AOSW set line 201. The present embodiment contains the above described functions, but it is not limited to these functions, and functions may be changed or eliminated, or circuits having separate functions may be added. The input data from the adjacent cells can also be output, unchanged, by setting the constant value output circuit CONST to output a 0, and by setting the input from the adjacent cells to be added to the value of the constant value output circuit CONST. This operation of outputting the input data as is (unchanged) can be performed by using the multiplier MULT and the multiplexer MUX.

The input to the arithmetic logic circuit ALU connects to the adder/subtracter ADD_SUB, the multiplier MULT, the NAND circuit, the XOR circuit, and the multiplexer MUX. The input from the configuration memory CM includes the instruction word set line 200 and the output switch AOSW set line 201.

The adder/subtracter ADD_SUB, the multiplier MULT, the NAND circuit, the XOR circuit, the multiplexer MUX, and the constant value output circuit CONST perform each operation by complying with instructions from the instruction word set line 200 that have been output from the configuration memory CM. These instructions, for example, can select whether to implement adding or subtracting in the adder/subtracter ADD_SUB or to calculate with a sign or without a sign.

Figure 5:
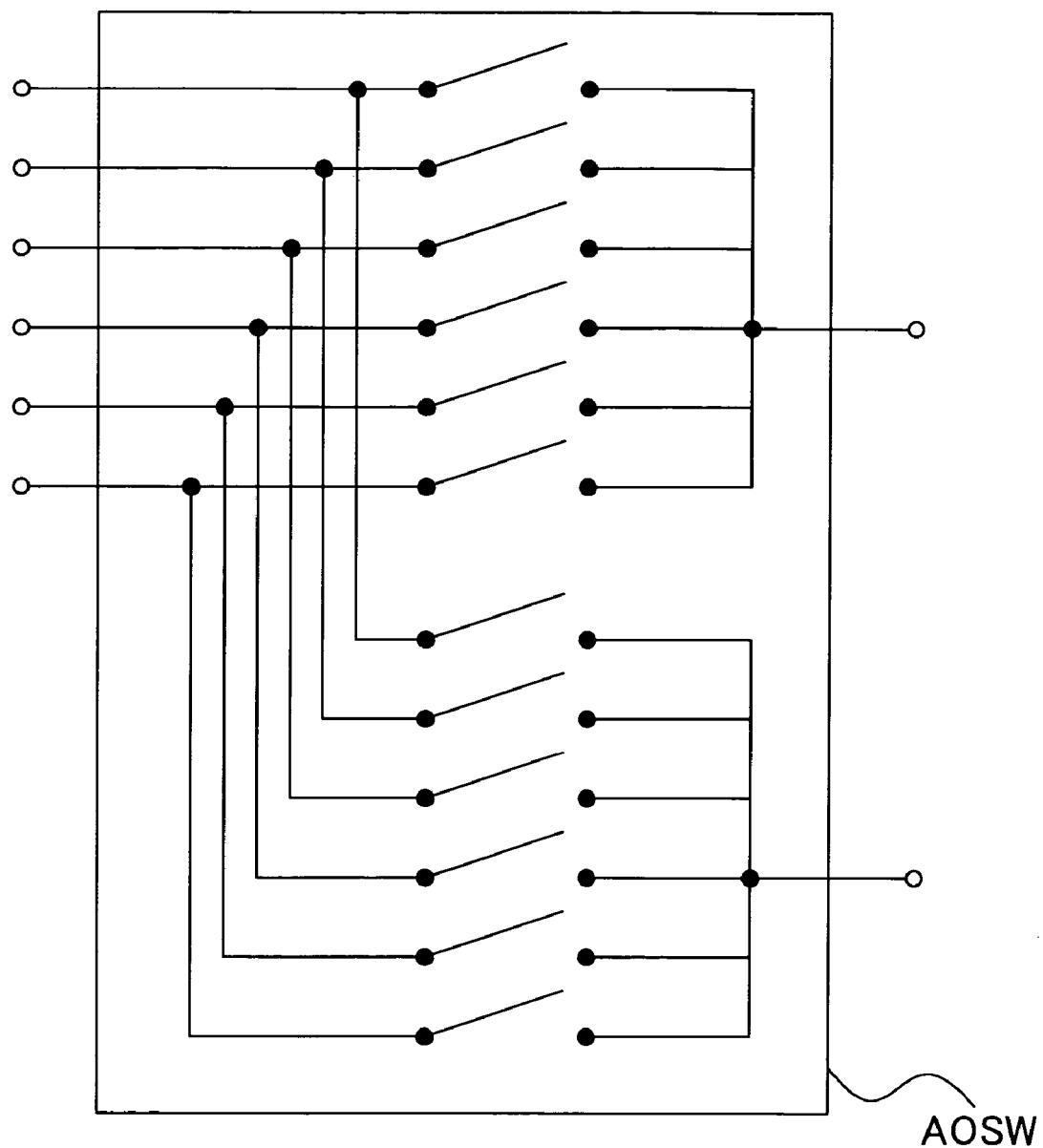
FIG. 5 is a circuit diagram showing one arrangement of the output select switches in FIG. 4.

The output select switch AOSW receives the outputs from the adder/subtracter ADD_SUB, the multiplier MULT, the NAND circuit, the XOR circuit, and the multiplexer MUX, and the constant value output circuit CONST and outputs an input specified by the output select switch AOSW set line 201 from the configuration memory CM. FIG. 5 is a circuit diagram showing an example of the output select switch AOSW. The example in this embodiment contains two 6-to-1 selectors that are capable of selecting one output from six inputs. The output select switch AOSW is structured according to the number of inputs and outputs and is not limited to these two 6-to-1 selectors.

This structure allows the arithmetic logic circuit ALU to select two from among multiple calculation result data items according to instructions from the configuration memory CM.

Figure 6:
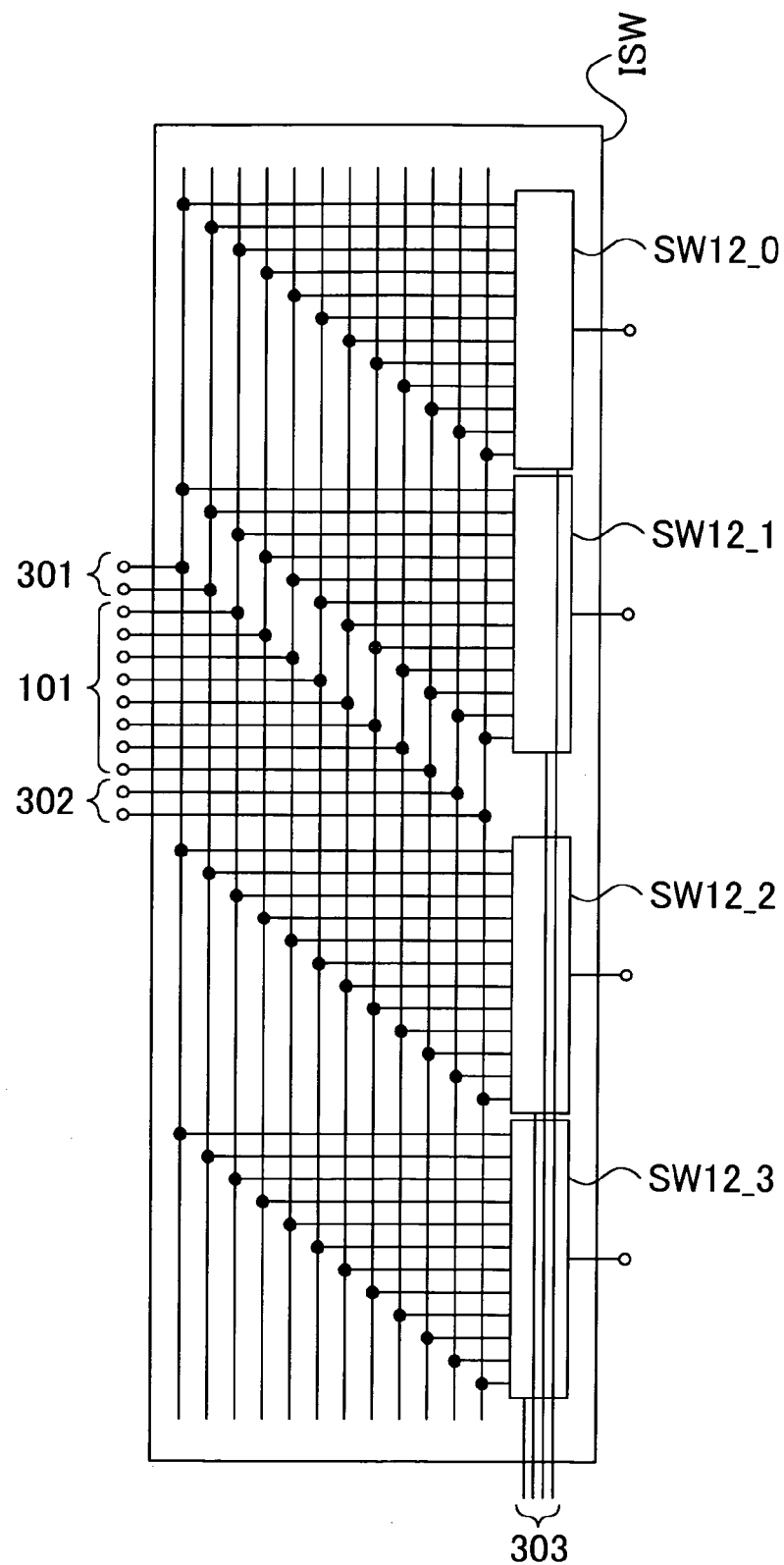
FIG. 6 is a circuit diagram showing an input switch array as a structural element of the basic cell.
Figure 7:
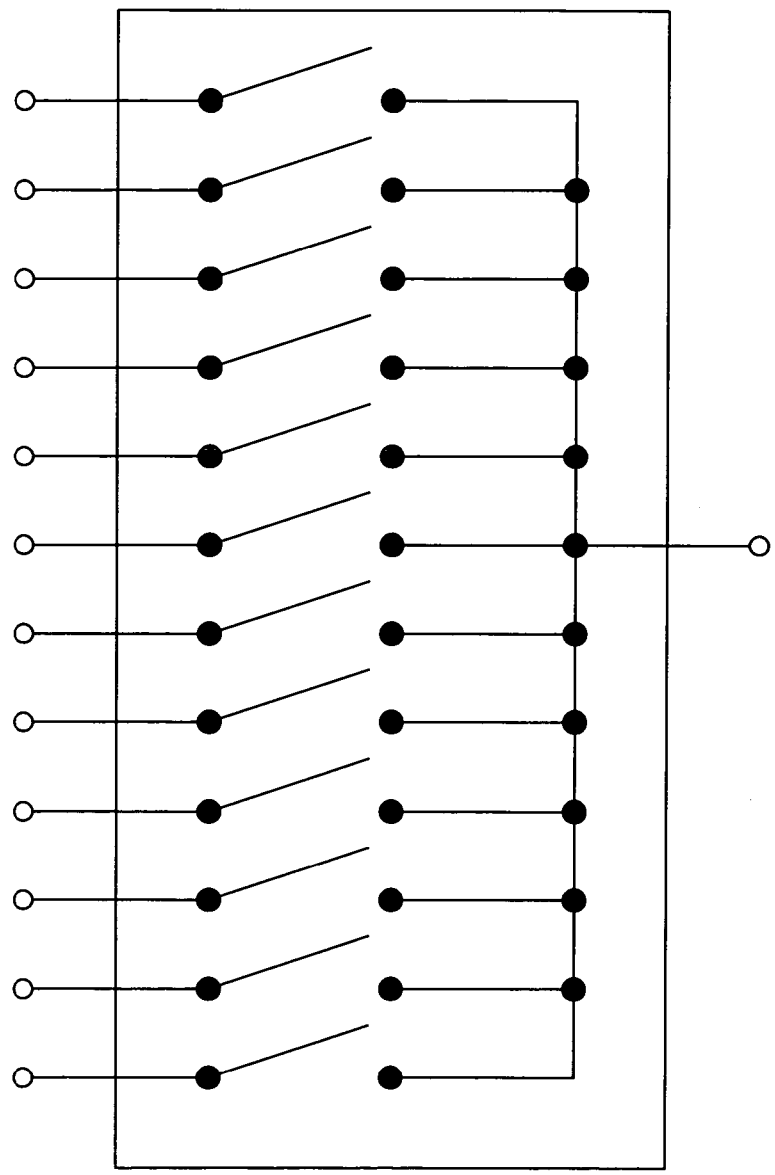
FIG. 7 is a circuit diagram showing the structure of the input switches in FIG. 6.

FIG. 6 is a circuit diagram showing the structure of the input switch ISW within the basic cell 100 of FIG. 2. The input switch ISW shown in FIG. 6 is capable of selecting and outputting four inputs from among twelve inputs, including the input 301 from the data-transfer flip-flop RFF, the input 302 from the result storage flip-flop CFF, and input 101 from the adjacent cells, since it contains four 12-to-1 selectors SW12_i (i is 0, 1, 2, 3), as shown in FIG. 7, for selecting one input from among the twelve inputs. Data from the input switch setting signal 303 from the output of the configuration memory CM is output to the selector SW12_i.

Figure 8:
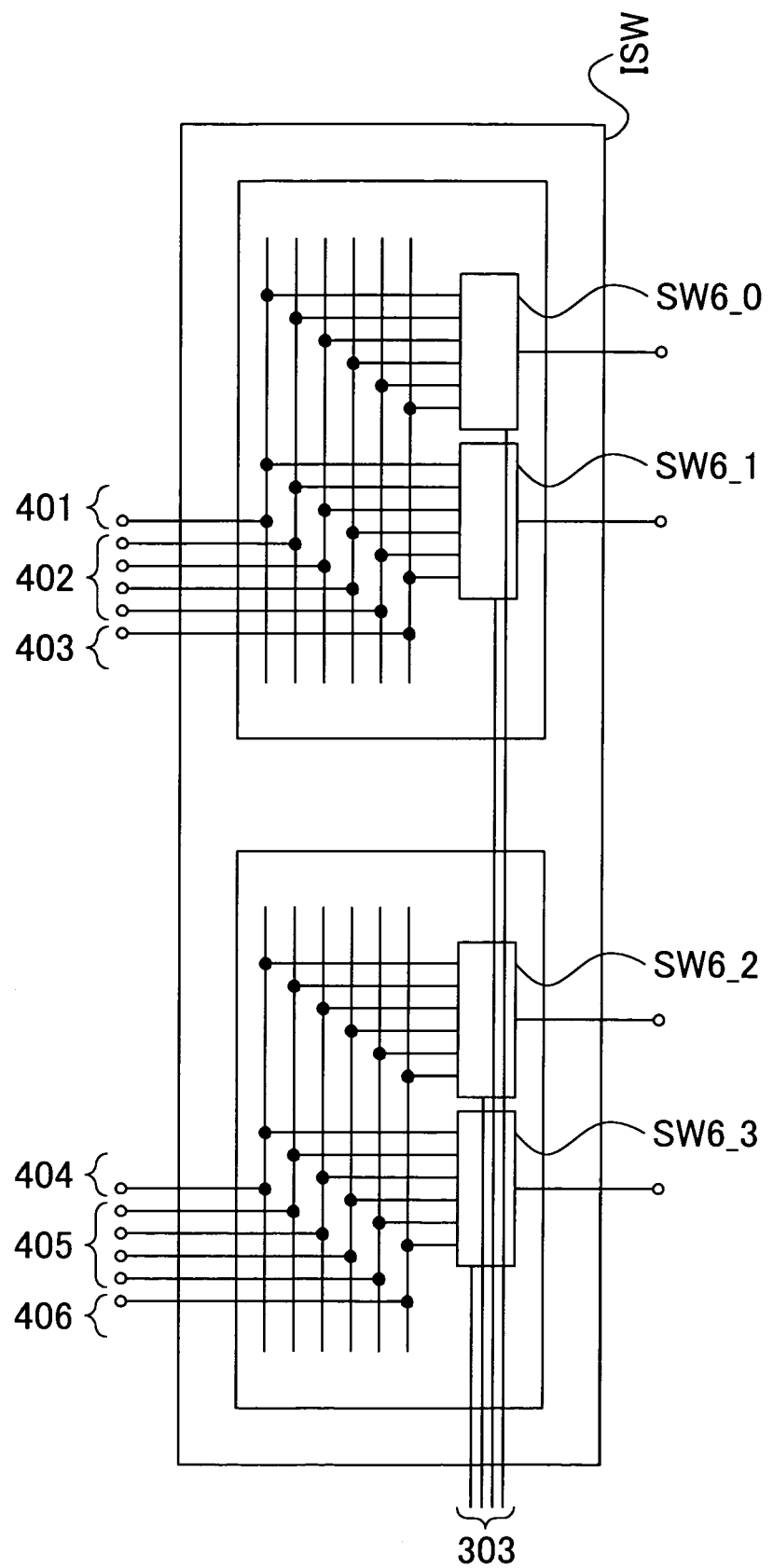
FIG. 8 is a circuit diagram showing a second structure of the input switch serving as a basic element of the basic cell.
Figure 9:
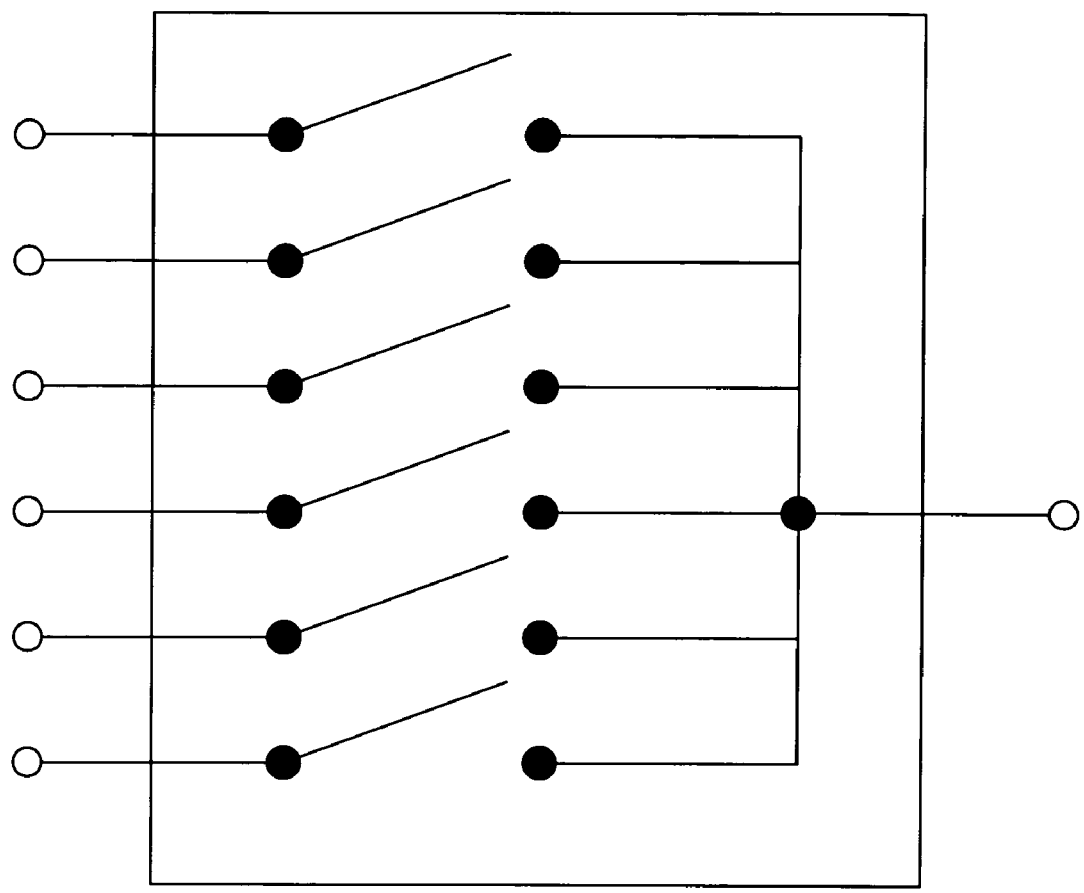
FIG. 9 is a circuit diagram showing the structure of the input switch of FIG. 8.

FIG. 8 and FIG. 9 are circuit diagrams showing examples of other structures of the input switch ISW in the basic cell of FIG. 2 that are different from the ISW structures of FIG. 6 and FIG. 7. In order to reduce the switch area, this structure contains four of the 6-to-1 switches SW6_i (i is 0, 1, 2, 3), as shown in FIG. 9. The data output from each of the selectors SW6_i is specified by the select signal 303. The basic cell 100 of FIG. 2 has two each of the inputs 101 from each of adjacent cells, and the data-transfer flip-flop RFF, and the result storage flip-flop CFF so that each input is separated into two groups. In other words, the input from the data-transfer flip-flop RFF0 is connected to 401, the input from the data-transfer flip-flop RFF1 is connected to 404, the input from the result storage flip-flop CFF0 is connected to 403, the input from the result storage flip-flop CFF1 is connected to 406, the first group of input 101 from the adjacent cells is connected to 402, and the second group input 101 from the adjacent cells is connected to 405. The data output from the SW6_i is specified by the input switch select signal 303 that is output from the configuration memory CM. By forming the inputs into multiple groups in this way, the size of the input switches ISW can be made small even in cases where the number of inputs is larger than those in the present embodiment.

Figure 10:
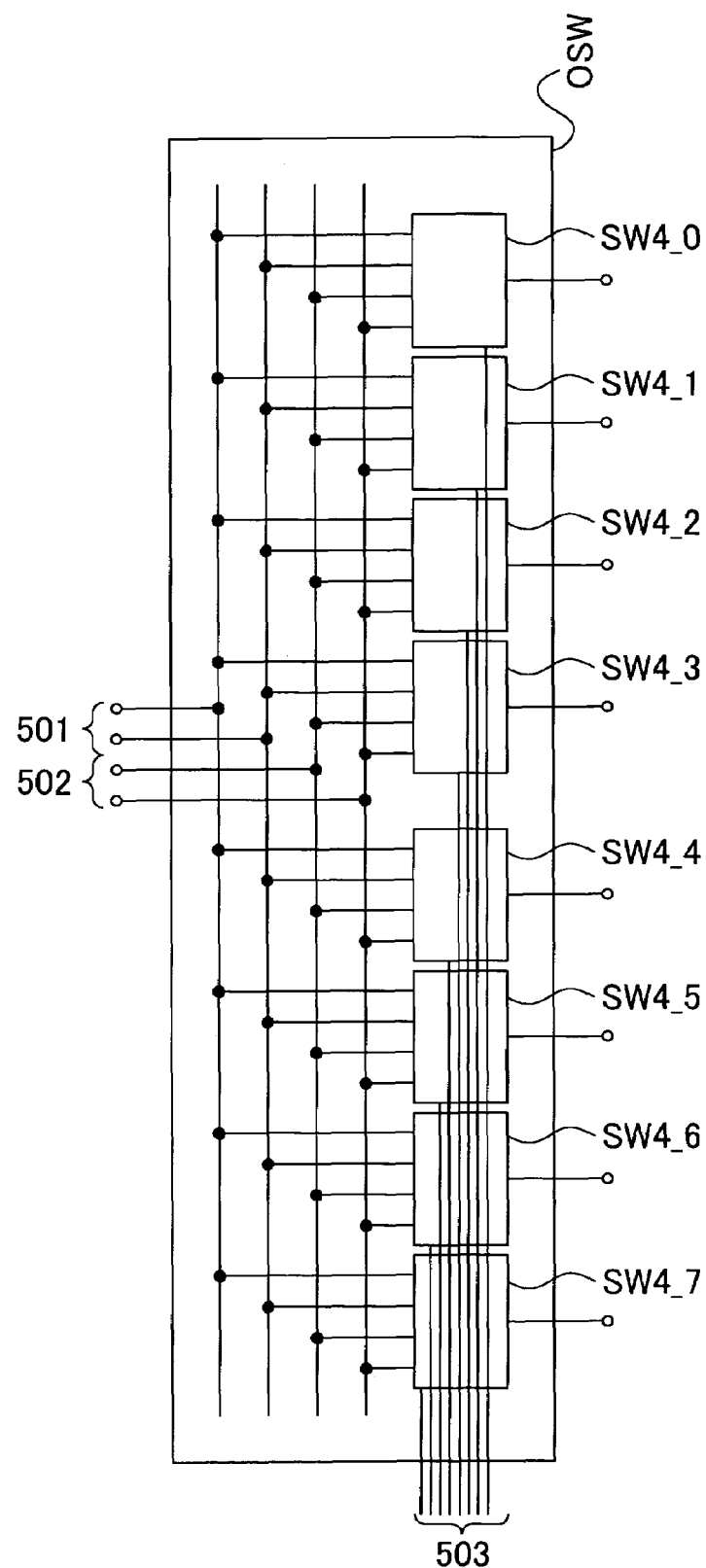
FIG. 10 is a circuit diagram showing the structure of the output switches serving as a basic element of the basic cell.
Figure 11:
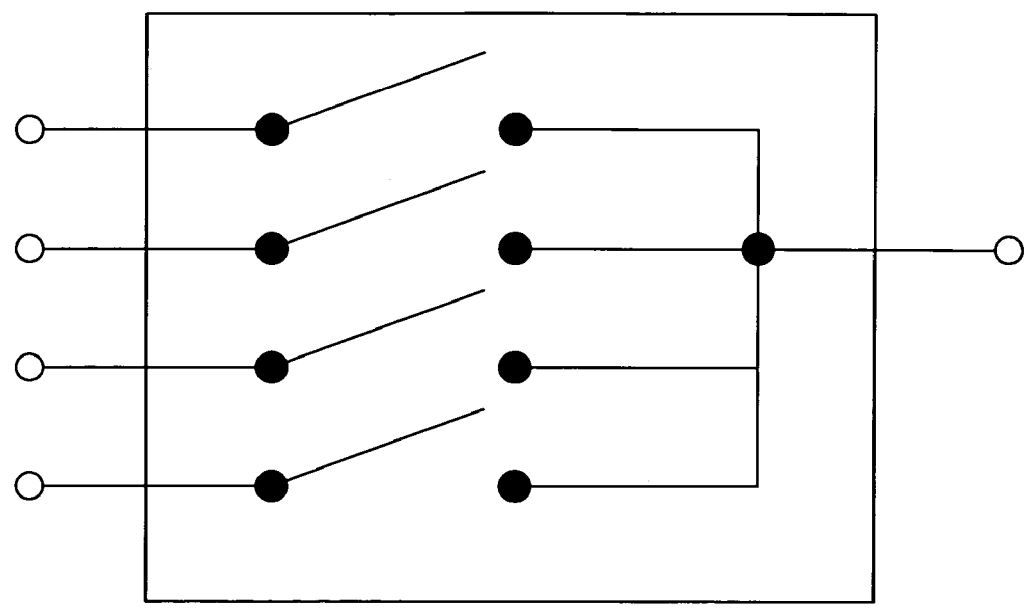
FIG. 11 is a circuit diagram showing the structure of the output switch in FIG. 10.

FIG. 10 is a block diagram showing the structure of the output switch OSW in the basic cell 100 of FIG. 2. The output switch OSW can be connected to the input wire 501 from the data-transfer flip-flop RFF, and the input 502 from the result storage flip-flop CFF to the desired output wire. The output switch OSW of the present embodiment has four inputs and eight outputs, and so it is comprised of eight 4-to-1 selectors SW4_i (i is 0 through 7) for selecting one input from among four inputs, as shown in FIG. 11. The data output from SW4_i is specified by output switch OSW set signal 503 that is output from the configuration memory CM.

Figure 12:
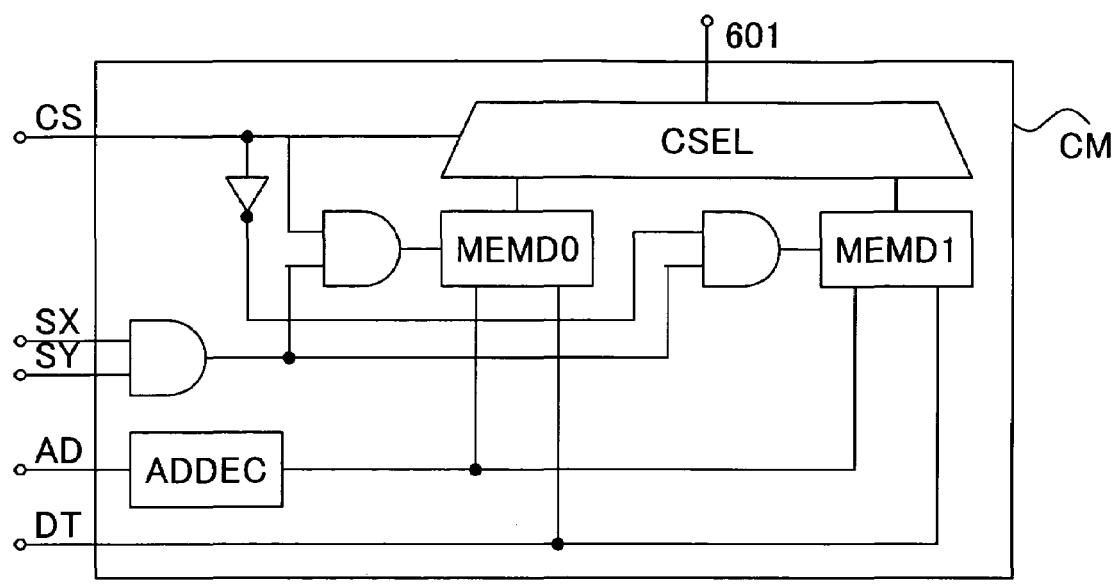
FIG. 12 is a circuit diagram showing the structure of the configuration memory as a basic element of the basic cell.

FIG. 12 is a block diagram showing the structure of the configuration memory CM in the basic cell 100 of FIG. 2. The configuration memory CM is comprised of a configuration selector CSEL, a configuration memory device MEMD, an address decoder ADDEC, a configuration select signal line CS, cell select signal lines SX and SY, an address signal line AD, a data signal line DT, and a configuration output line 601. The configuration information select signal line CS, the data input line DT for changing the configuration information, the cell select signal lines SX and SY, and the address input line AD for changing the configuration information are respectively input from the configuration controller CCNT.

The configuration selector CSEL outputs a value selected from among the configuration memory devices MEMD0 and MEMD1, according to the instruction on the configuration select signal line CS. The output from the configuration selector CSEL contains an input switch ISW set signal, an output switch OSW set signal, and an arithmetic logic circuit ALU set signal. Two configuration memory devices MEMD are shown in FIG. 12, however the present invention is not limited to two memory devices.

The configuration memory devices MEMD selected by the configuration select signal line CS may have a structure that does not allow rewriting. When this type of structure is utilized, two configuration memory devices MEMD are available so that while one device is performing the selected processing, the other can be rewritten. In rewriting the configuration memory device MEMD, the device is not selected by the configuration select signal line CS; and, further, in a state where the cell select signal lines SX and SY are selected by their own cell, the address within the MEMD obtained from the address line AD is decoded by the address decoder ADDEC, and the data of the configuration memory device MEMD matching that address is rewritten in data input from the data line DT. Specifying the storage location within the MEMD, or, in other words, specifying the address to write data on a memory device among the multiple memory devices within the MEMD, allows rewriting a configuration memory device MEMD with a bit width that is wider than the data line DT.

In the present embodiment, latches are utilized in the configuration memory device MEMD. Inputs to the MEMD, other than the data signal line DT, latch the data signal line DT as latch control signals. Volatile memories, such as flip-flops and a SRAM, and non-volatile memories, such as flash memories and a MRAM, can also be utilized in the configuration memory device MEMD. Using a non-volatile memory retains the configuration information even when the power supply has been shut off and then restarted or started up, so that there is no need to set the configuration information when the power supply is started up (turned on).

Utilizing the basic cell 100 having the above-described structure makes the wiring area formed in the related art unnecessary. Therefore, even when changing the number of cell arrays comprising the basic cell 100, the design is simple, since there is no need to change the switch layout in the wiring area. In other words, in a design utilizing DA, for example, a layout of basic cells 100 can be pre-registered as one module, and the device is easily designed by just arranging the number of required basic cells 100 in arrays.

Figure 13:
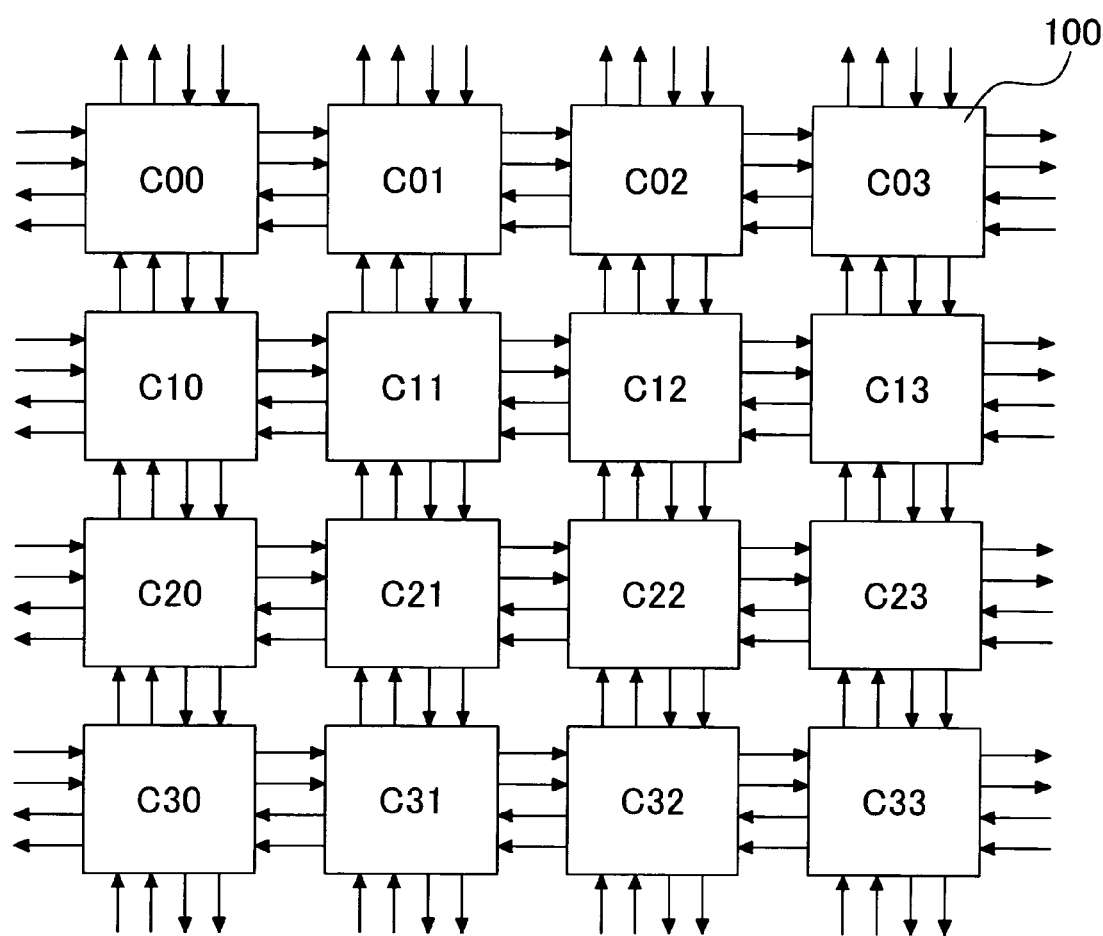
FIG. 13 is a circuit diagram showing an example of wiring between cells when utilizing the basic cells of the present invention, formed in a two-dimensional array.

FIG. 13 is a block diagram showing the wiring connections for data transfer between cells when the basic cells 100 of the present invention are connected in arrays. The basic cells 100 in FIG. 13 are installed in a two-dimensional array of four lines and four columns. The upper/lower/right/left adjacent cells of the basic cell 100 are each connected by two wires for input and output. So when transferring data to cells in separate locations, the data is sent by conveying it between the intermediate cells. For example, when sending data from cell C00 to cell C02, the data can be sent by way of the C01.

In transferring data in the basic cell 100, to pass data through either the data-transfer flip-flop RFF or the result storage flip-flop CFF within the basic cell 100, the wire length that represents the transmit path between the flip-flops of each cell is always established for one cell portion or, in other words, one clock cycle, regardless of the configuration information. Consequently, except for changes in configuration information, the operating frequency of the cell array does not depend on the configuration information, and it can operate at a high frequency where only the delay of one cell needs to be always taken into account.

Figure 14:
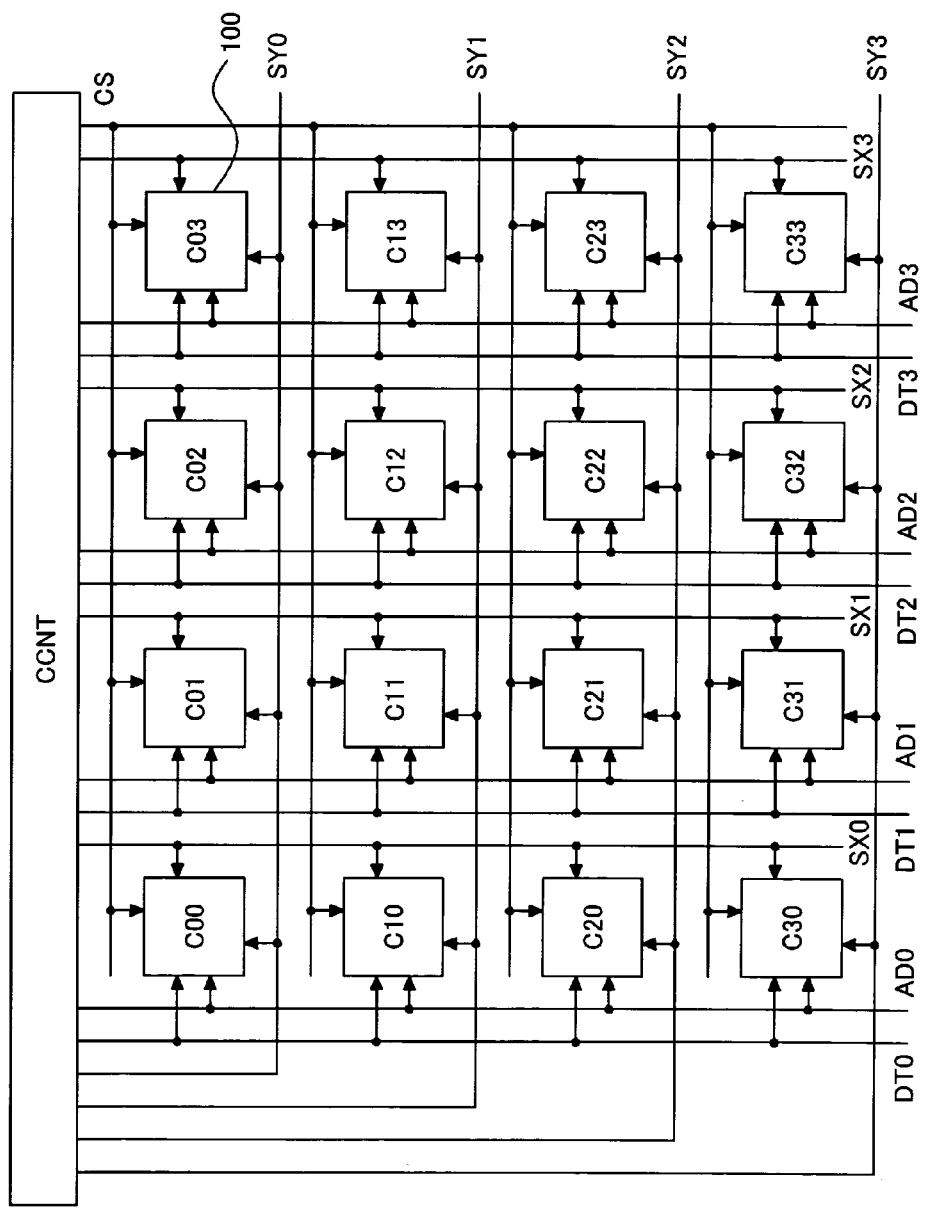
FIG. 14 is a circuit diagram showing an example of the wiring for configuration information changes when utilizing the basic cells of the present invention, formed in a two-dimensional array.

FIG. 14 is a diagram showing the configuration wiring for the overall cell array when connecting the basic cells 100 of the present invention in arrays. In FIG. 14, the basic cells 100 are formed in a two-dimensional array of 4 rows (lines) and 4 columns. The wiring from the configuration controller CCNT connects to each cell via the configuration select signal CS, and the data signals from DT0 to DT3, and the address signals from AD0 to AD3, and the cell array column select signals from SX0 to SX3, and the cell array row (line) signals from SY0 to SY3.

The configuration select signal CS to each cell specifies configuration information stored in the configuration memory CM of each cell. The data signal DT, address signal AD, and the cell array column select signal SX are formed in each column of the cell array, and they connect to each cell in the same column. The cell array line select signal line SY is formed in the line (row) of each cell array, and it connects to each cell in the same line.

The procedure for the configuration controller CCNT to rewrite the configuration memory CM in each cell will be described next. The configuration controller CCNT first of all selects the cell in which to change the configuration information of the cell array using the cell array column select signal SX and the cell array line select signal SY. The configuration controller CCNT next specifies the address of the configuration memory device MEMD within the cell using the address signal AD. The configuration controller CCNT then sends the data using the data signal DT and writes the configuration information in the configuration memory device MEMD.

The configuration controller functions include a function to load the configuration information from an external memory, a function to rewrite the configuration memory CM in each cell, and a function to change the configuration information for changing and implementing the configuration signal CS.

In this structure, the configuration select signal (line) CS is connected to all cells on the same line. However in other structures, the configuration select signals CS are sent separately, for example, to areas of four cells each, and only the configuration information for a portion of the cell arrays can be changed.

Figure 15:
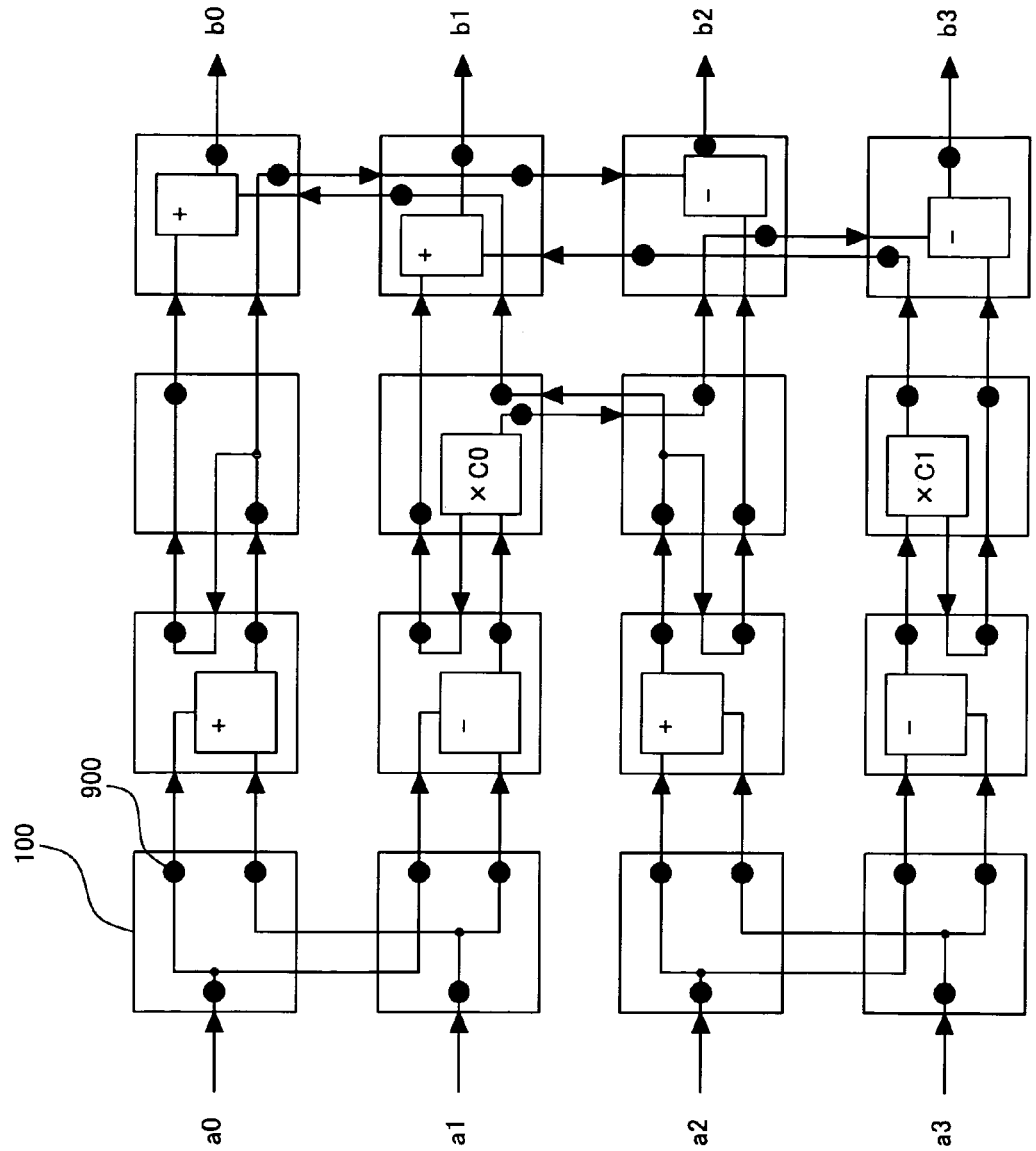
FIG. 15 is a circuit diagram showing configuration information when implementing a portion of the fast Fourier transform with the basic cells of the present invention, formed in a two-dimensional array of four rows and four columns.

FIG. 15 is a diagram showing configuration information for implementing a portion of the fast Fourier transform often utilized in signal processing, for example, of the basic cells arranged in the four line, four column array of FIG. 2. The operation of the four line, four column cell array will be described next with reference to FIG. 15. The symbols (+, −, ×C0, ×C1) written within the blocks inside the basic cells 100 of FIG. 15 express the functions implemented by cells of the arithmetic logic circuit ALU. The straight lines and arrows indicate the flow of the data. The black circles 900 shown on the straight lines within the cells show the data-transfer flip-flops RFF or result storage flip-flops CFF and indicate that one clock cycle is used for transferring data.

In the configuration information shown in FIG. 15, the values from b0 to b3 are found by the following formulas.

$$b0=(a0+a1)+(a2+a3),$$

$$b1=(a0-a1)\times C0+(a2-a3)\times C1,$$

$$b2=(a0+a1)-(a2+a3),$$

$$b4=(a0-a1)\times C0-(a2-a3)\times C1,$$

In these formulas, the values from a0 to a3 are input data, the values from b0 to b3 are output data, and the values C0 and C1 are predetermined coefficients for the fast Fourier transforms.

The input data from a0 to a3 are input simultaneously from the left side of the cell array. The values C0 and C1 utilized in multiplication are supplied in the configuration information to the cell. The calculations of (a0+a1) and (a0−a1) and (a2+a3) and (a2−a3) to be performed are assigned to cells of the second columns from the left. The same data is used in two locations each for data input to the second column cells, so that the data of the second column cells is allotted using the first column cells. A look at the input to the line 1, column 2 cell shows that two clock cycles are required, since a1 must pass through the line 1, column 1 cell and the line 2, column 1 cell. However, a0 only passes the line 1, column 1 (1st line 1st column) cell, and so it cannot synchronize with the a1 data arriving at the line 1, column 2 cell in a minimum of one clock cycle. Therefore, two data transfer flip-flops are utilized to make the data arrive at the line 1, column 2 cell in two clock cycles. Input to the other cells in the second column is also synchronized with the clock cycle in the same way.

The line 2, column 3 cell and the line 4, column 3 cell are multiplied in the 3rd column cell. No calculation is performed at this time since absolutely the same timing is used for outputting the results output from the line 1, column 3 cell and the line 3, column 3 cell.

Results of calculations made up till now are input to the 4th column cell and adding or subtracting is performed. Input to the 4th column cell also requires adjusting the clock cycle the same as for input to the 2nd column cell. A look at the line 1, column 4 cell, for example, shows that three clock cycles are required for input from the line 3, column 3 cell. The input from line 1, column 3 cell therefore adjusts the synchronization by utilizing the data transfer flip-flop of the adjacent line 1, column 2 cell, and the data transfer flip-flop of its own cell. The other cells are also synchronized with the clock cycle in the same way. Finally, four data, from b0 to b3, are simultaneously output from the 4th column cell.

When establishing the configuration information as described above, the required number of clock cycles, or in other words, the latency of input from a0 through a3 to output from b0 through b3, is seven cycles.

Figure 16:
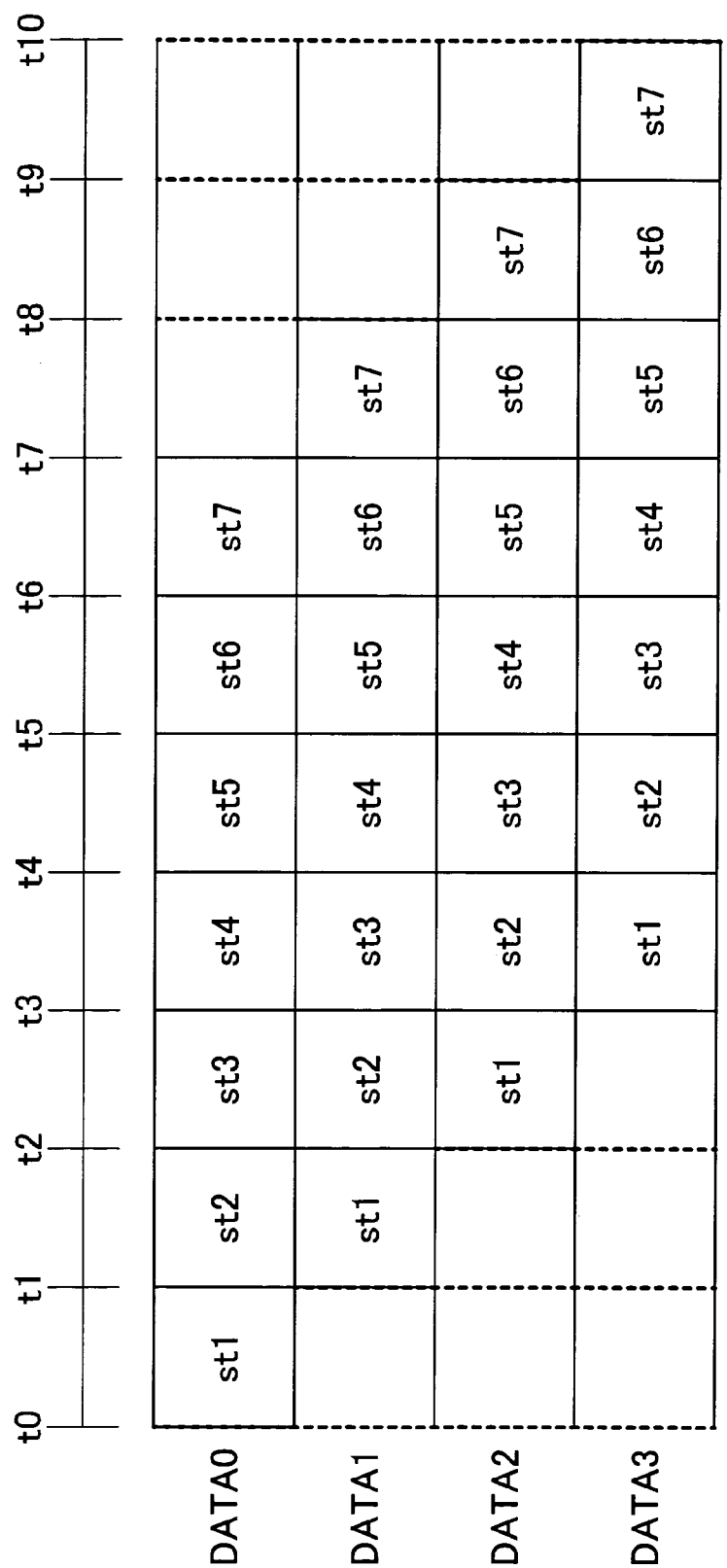
FIG. 16 is a diagram showing the operation when pipeline processing was implemented with circuits of the configuration information shown in FIG. 15.

Implementing the pipeline processing of FIG. 16 will be described here using the configuration information shown in FIG. 15. There are seven pipeline stages for processing the configuration information of FIG. 15. In stage 1 st1 and Stage 2 st2, the data in the first column of the cell is transferred. Addition or subtraction is performed in Stage 3 st3 by the second column cell. In Stage 4 st4, multiplication of the 3rd column cell is performed. In Stage 5 st5 and st6, the output of Stage 3 st3 is transferred to the 4th column cell. In Stage 7 st7, addition or subtraction is performed and the result is output.

The inputs a0, a1, a2, and a3 at the time t0 are set here as Data 0. The input at time 1 is set as Data 1, the input at time 2 is set as Data 2, the input at time 3 is set as Data 3 in the same way. The input Data 0 at this time passes from 0 through 7 stages and is output after time t7 or, in other words, after seven clock cycles. Pipeline processing can be performed since each stage operates in parallel and the results from input Data 1 at time t1 are output at time t8 and data is output in the same way thereafter, with an output being sent one clock cycle after output of the prior input. Extremely high performance can therefore be obtained by one output of data at each clock cycle.

In the configuration information shown in FIG. 15, the wiring and the calculation are performed in both directions by the cells of the 2nd column, the cells of line 2 and line 4 in the 3rd column, and the cells of the 4th column. The is arithmetic logic circuit ALU is used effectively. A structure can also be configured to use the arithmetic logic circuit ALU even more effectively by adjusting the number of data-transfer flip-flops RFF within the cell.

Figure 17:
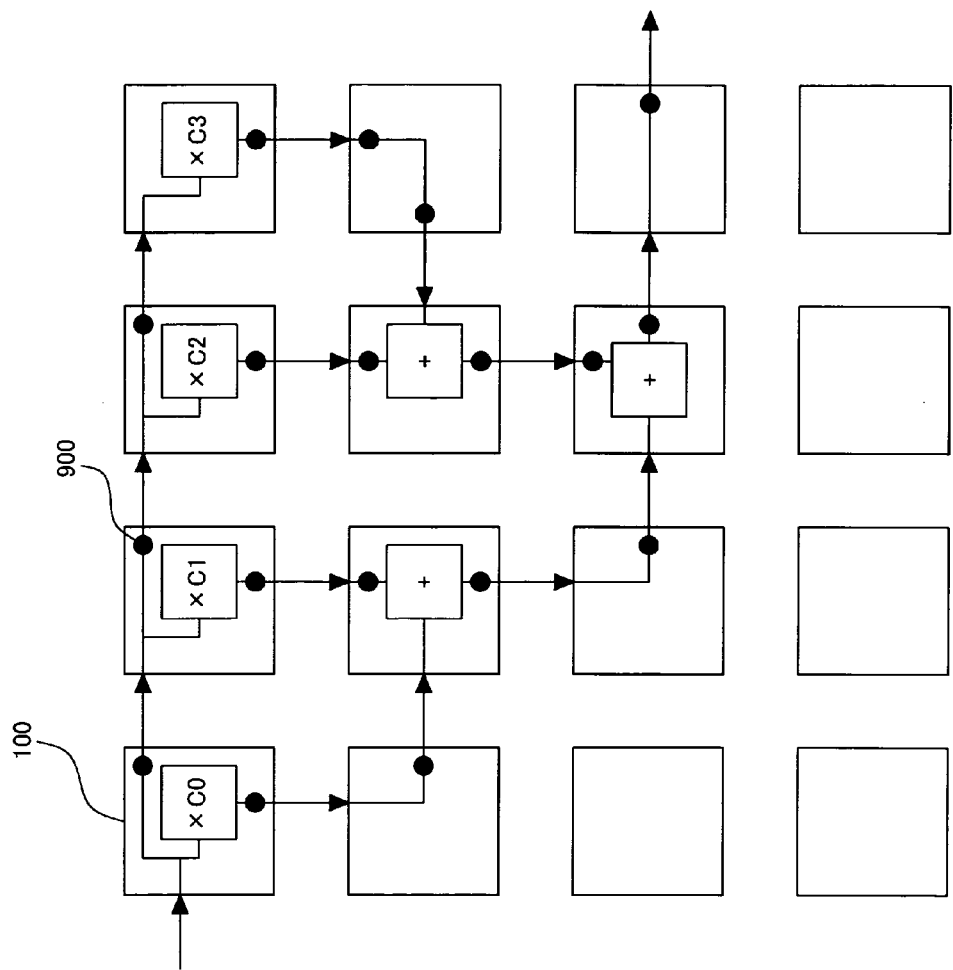
FIG. 17 is a diagram showing the configuration information during filtering with the basic cells of the present invention, formed in a two-dimensional array of four rows and four columns.

FIG. 17 is a diagram showing the configuration information for performing filtering, such as for the type of signal processing often utilized on the basic cells of FIG. 1, which are formed in a two-dimensional array of four rows (lines) of cells and four columns of cells. The operation of this four line, four column cell array will be described next utilizing FIG. 17. The symbols (×C0, ×C1, ×C2, ×C3) written within the blocks within the basic cells 100 of FIG. 17 indicate the function executed by the arithmetic logic circuit ALU of the cell, and the straight lines and arrows show the flow of the data. The black circles 900 shown on the straight lines within the cells indicate the data-transfer flip-flops RFF or result storage flip-flops CFF.

In the configuration information in FIG. 17, the values were found with the following formula:

$$f[t]=e[t]\times C0+e[t-1]\times C1+e[t-2]\times C2+e[t-3]\times C3$$

In the above formula, f[t] is the filter output at time t, e[t] is the input to the filter at time t, and C0 through C3 are the filter coefficients.

According to this configuration information, transfer of data to the right-side cell and multiplication are performed in the 1st line of cells. Addition is performed using the 2nd and 3rd column cells.

By inputting an input e from the 1 st line, 1 st column cell at each timing, in a cell array set with this configuration information, a filter output f can be obtained from the 3rd line, 4th column cell at each cycle from the 9th clock cycle onwards.

The circuit containing the cell array using the basic cells of the present invention can select the configuration information shown in FIG. 15 for fast Fourier conversion or the configuration information shown in FIG. 17 for filtering, and different processing can be executed with the same cell array circuit. The processing that can be executed is not limited to these two examples and processing of different types can be executed by changing the configuration information.

Figure 18:
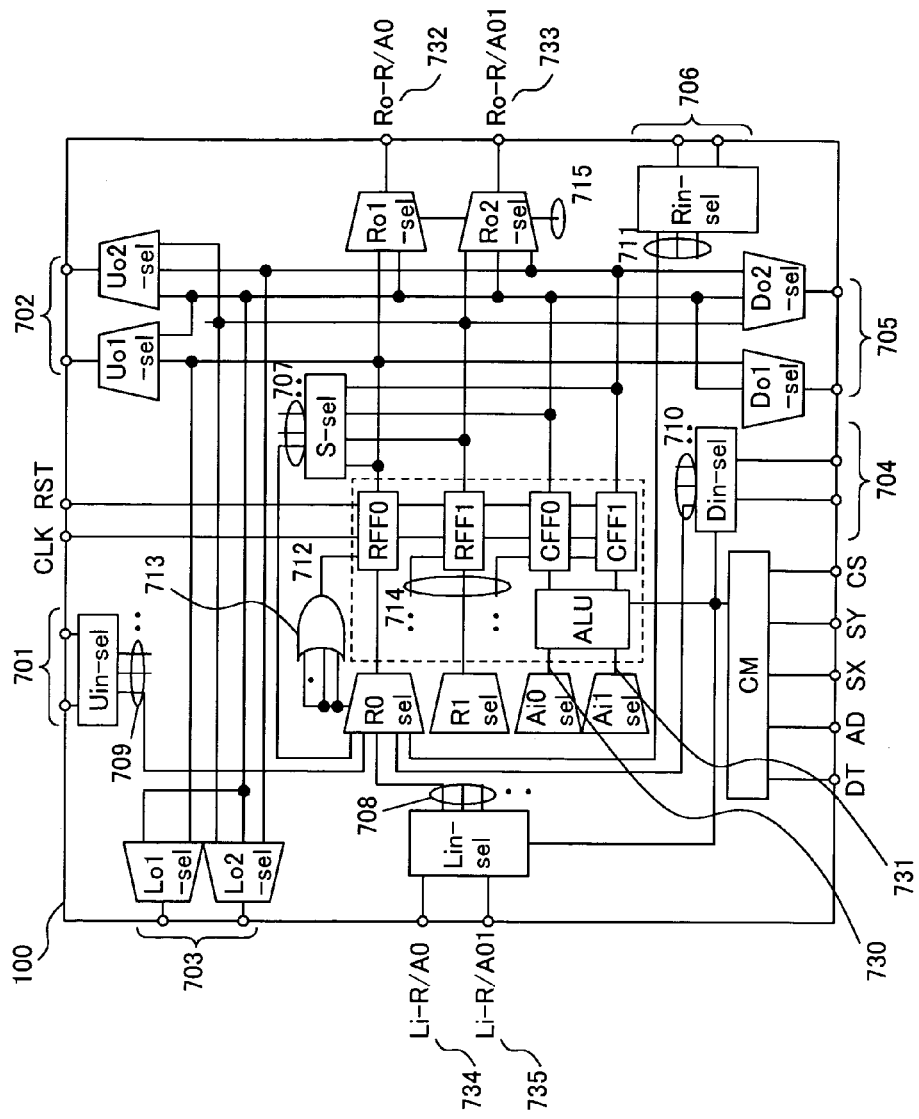
FIG. 18 is a circuit diagram showing the basic cells of the present invention mainly for the selector structure within the cell.
Figure 19:
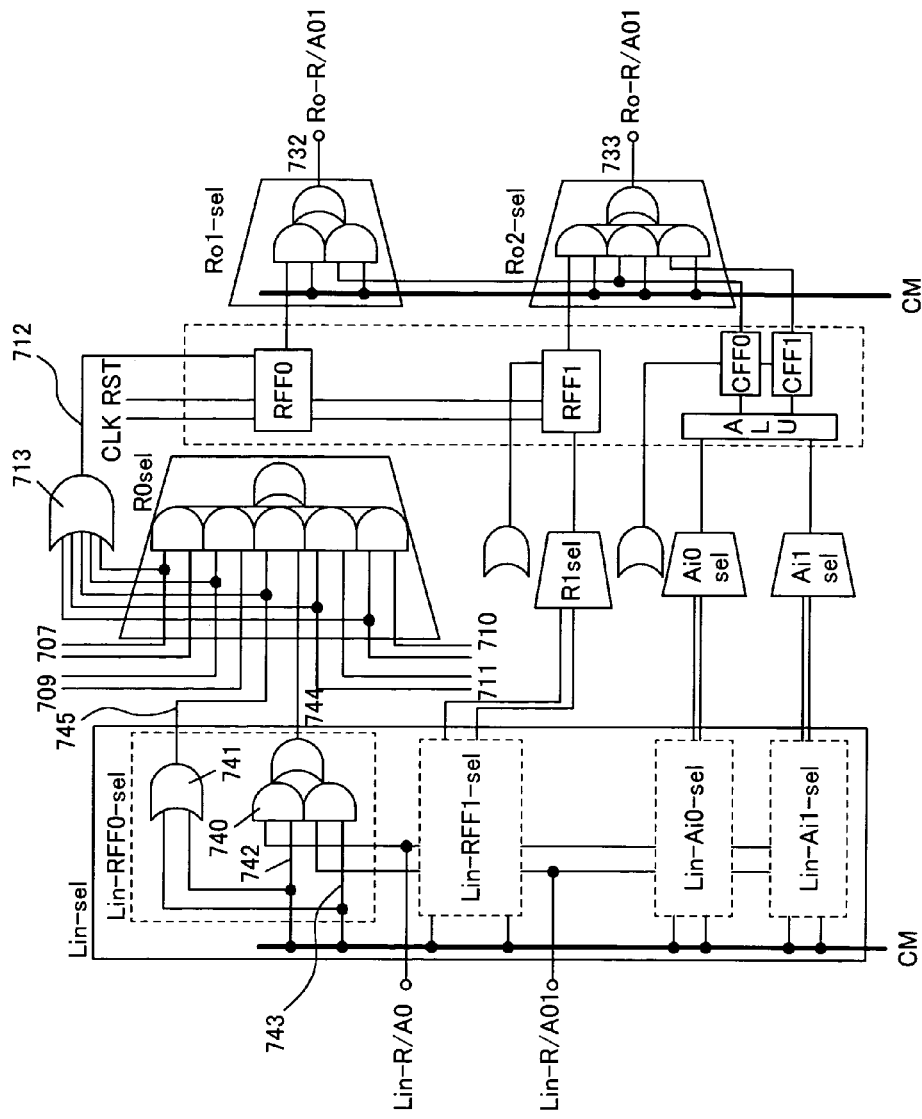
FIG. 19 is a circuit diagram showing the logic structure of the selectors within the basic cell in the present invention.

The detailed circuit structure of the basic cell 100 shown in FIG. 2 will be described next with reference to FIG. 18 and FIG. 19. FIG. 18 is a diagram for clearly showing the data input source and data output destination of the selectors within the basic cell in FIG. 2.

The input switch ISW in FIG. 2 has the left-side input selector Lin-sel, the upper-side input selector Uin-sel, the right-side input selector Rin-sel, the lower-side input selector Din-sel, the feedback input signal selector S-sel, the input selector for data-transfer flip-flops R0sel, R1sel, and the input selector for arithmetic circuits Ai0sel, Ailsel. The output switch OSW has the left-side output selectors Lo1-sel and Lo2-sel, the upper-side output selectors Uo1-sel and Uo2-sel, the right-side output selectors Ro1-sel and Ro2-sel, the lower side output selectors Do1-sel and Do2-sel. The input line 101 in FIG. 2 corresponds to the input lines 701, 704, 706, 734, and 735 in FIG. 18. The output line 102 in FIG. 2 corresponds to the output lines 702, 703, 705, 732, and 733 in FIG. 18. Other items with identical reference numbers represent the same items.

The input switch ISW in FIG. 2 can be sub-grouped into a first selector circuit group containing Lin-sel, Uin-sel, Rin-sel, Din-sel, and S-sel for selecting one of input data from adjacent cells and the internal feedback-loop, and a second selector circuit group containing Ro-sel, R1-sel, Ai0sel, and Ailsel for selecting input data of RFF0, RFF1, and the arithmetic logic circuits ALU from output data of the first selector circuit group. In the output switch OSW, the Lo1-sel, Lo2-sel, Uo1-sel, Uo2-sel, Ro1-sel, Ro2-sel, Do1-sel, and Do2-sel circuits select the data held in the data-transfer flip-flops RFF0, RFF1 and in the flip-flops CFF0, CFF1, to any of the basic adjacent cells. This selection is made in order to reduce the number of cell terminals (number of input lines, number of output lines). For example, the Ro1-sel and Ro2-sel circuits select data towards the rightward adjacent cell. In the same way, <Lo1-sel and Lo2-sel>, <Uo1-sel and Uo2-sel>, and <Do1-sel and Do2-sel> select data towards each of the left, upper and lower directions.

In other words, the selectors shown in FIG. 18 are grouped into data input side selectors, such as Lin-sel, R0sel, and data output side selectors, such as Lo1-sel. The data input side selectors get input data from adjacent cells or an internal auto-loop, and then select input data of the RFF0, RFF1 and the arithmetic logic circuit ALU. The input side selector circuits are grouped into circuits to select data from the transmit source of each adjacent cell, such as Lin-sel, and into circuits to select data from memory circuits within the cell, such as R01-sel. The data output side selectors select two types of data from among four types of data output from the data-transfer flip-flops RFF0, RFF1, and the result storage flip-flops CFF0, CFF1 and output it to the adjacent basic cells.

The structure and function of the selectors on the data input and data output sides will be described in detail in connection with FIG. 19, taking the right-side input selector Lin-sel, and the data-transfer selector flip-flop Ro1-sel, the right-side output selectors Ro1-sel, Ro2-sel as examples.

First, the data input side selector circuit will be explained using Lin-sel and R0-sel as examples. The right-side input selector Lin-sel is made up of four selectors. These four selectors are the selector Lin-RFF0-sel, the selector Lin-RFF1-sel, Lin-A0-sel, and the selector Lin-A1-sel. Each selector inputs data from the input lines Lin-R/AD and Lin-R/A01 to the data-transfer flip-flops RFF0, RFF1, and it selects two from any of the four input operands of the arithmetic logic circuit ALU for transfer.

The selector Lin-RFF0-sel, for example, is comprised of selector circuits 740 and OR circuits 741. The selector circuits 740 select data from the Lin-R/A0 and Lin-R/A01 according to the control signals 742 and 743 received from the configuration memory CM and send the data to the data-transfer flip-flop RFF0. The control signal 742 is set to 1 and the control signal 743 is set to 0 when the Lin-R/A0 is selected. When Lin-R/A1 is selected, the control signal 742 is set to 0 and the control signal 743 is set to 1. If neither signal is selected, then the control signals 742 and 743 are both set to 0. The OR circuit 741 generates a control signal for showing that data was transferred to the RFF0. When the input signal of either the Lin-R/A0 or Lin-R/A1 has been selected, and data is sent to the data-transfer flip-flop RFF0, then it is set to 1 when selected, or to 0 when not selected. The Lin-RFF1-sel selects data from Lin-R/A0 and Lin-R/A01 for input to RFF1 in the same way. The Lin-Ai0-sel selects data from the Lin-R/A0 and the Lin-R/A01 for input to the first input operand of the ALU, and the Lin-Ail-sel selects data from the Lin-R/A0 and Lin-R/A01 for input to the second input operand of the ALU.

The selector for data transfer flip-flop R0sel receives a control signal (744 and 745 in Lin-sel) and transfers data for the data-transfer flip-flop RFF0 from Lin-sel, Uin-sel, S-sel, Rin-sel, Din-sel, which are selectors in its own loop, and for each direction of the adjacent cells, and the input selector selects data for input to RFF0. The control signal 713 is an OR circuit for control signals from each direction. The control signal 712 is an enable signal to change the data in the RFF0 and is set to 1 when there is a data transfer to the RFF0 and to 0 when there is not data transfer. The signals 707, 709, 710, 711 correspond to output signals from the S-sel, Uin-sel, Din-sel, and Rin-sel and contain control signals and transfer data.

The selector circuits on the data output side will be described next using Ro1-sel and Ro2-sel as examples. The selections Ro1-sel and Ro2-sel, as a set, select a combination from any of "one output of RFF0, RFF1 and one output of CFF0, CFF1", output both RFF0, RFF1" or "output both CFF0, CFF1". From the data-transfer flip-flops RFF0 and RFF1, either one may be selected when selecting only one. Therefore, in selecting RFF0, there will be four data combinations output from the output line Ro-R/A0, Ro-R/A01 comprised of (RFF0, CFF0), (RFF0, CFF1), (RFF0, RFF1), and (CFF0, CFF1). In other words, there will be six output combinations: (RFF0, CFF0), (RFF0, CFF1), (RFF1, CFF0), (RFF1, CFF1), (RFF0, RFF1) and (CFF0, CFF1). However, RFF0 and RFF1 have the same data holding function, so data input to RFF1 can be assigned to RFF0, when the combination is (RFF1, CFF0) and (RFF1, CFF1). The combination of (RFF1, CFF0), (RFF0, CFF1) can therefore be replaced by the (RFF0, CFF0), (RFF0, CFF1) combination, can be deleted, or the selector Ro1-sel can be made smaller. More specifically, the selector Ro1-sel can select the data of one or either of {RFF0, CFF0}, which is the item at the left of these combinations, as the output data from Ro-R/A0 to output. The selector Ro2-sel can select the data of one or either of {RFF1, CFF0, CFF1} which is the item on the right, as the output data from Ro-R/A01 to output.

Finally, the input line and output line will be described. Here, Lin-R/A0 represents a connection to the Ro-R/A0 left adjacent cell, and that data held in the data transfer flip-flop or the result storage flip-flop contained in the left adjacent cell is input to this line. Here, Lin-R/A01 is connected to the left adjacent cell of Ro-R/A01 in the same way. The Ro-R/A0 is connected to the right adjacent cell of Lin-R/A0, and it outputs data to the right adjacent cell. The Ro-R/A01 is connected to Lin-R/A01 of the right adjacent cell, and it outputs any of the data held in RFF1, CFF0, CFF1 to the right adjacent-cell.

Figure 20:
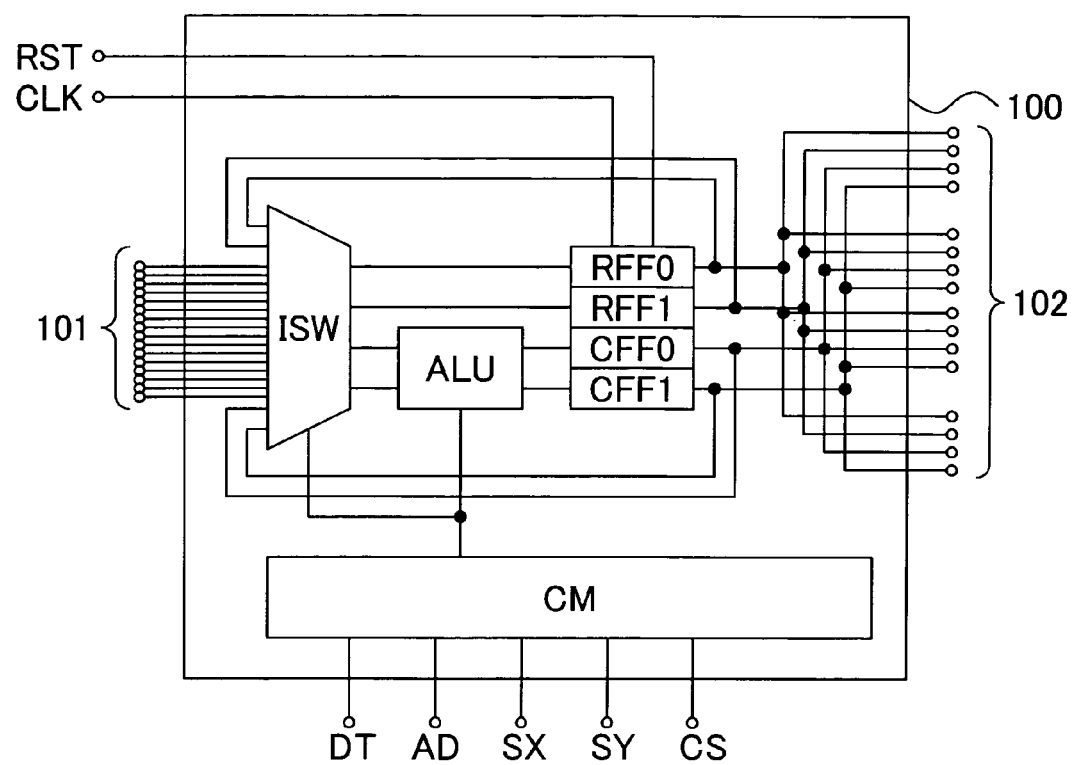
FIG. 20 is a circuit diagram of another embodiment of the basic cell in FIG. 2.
Figure 21:
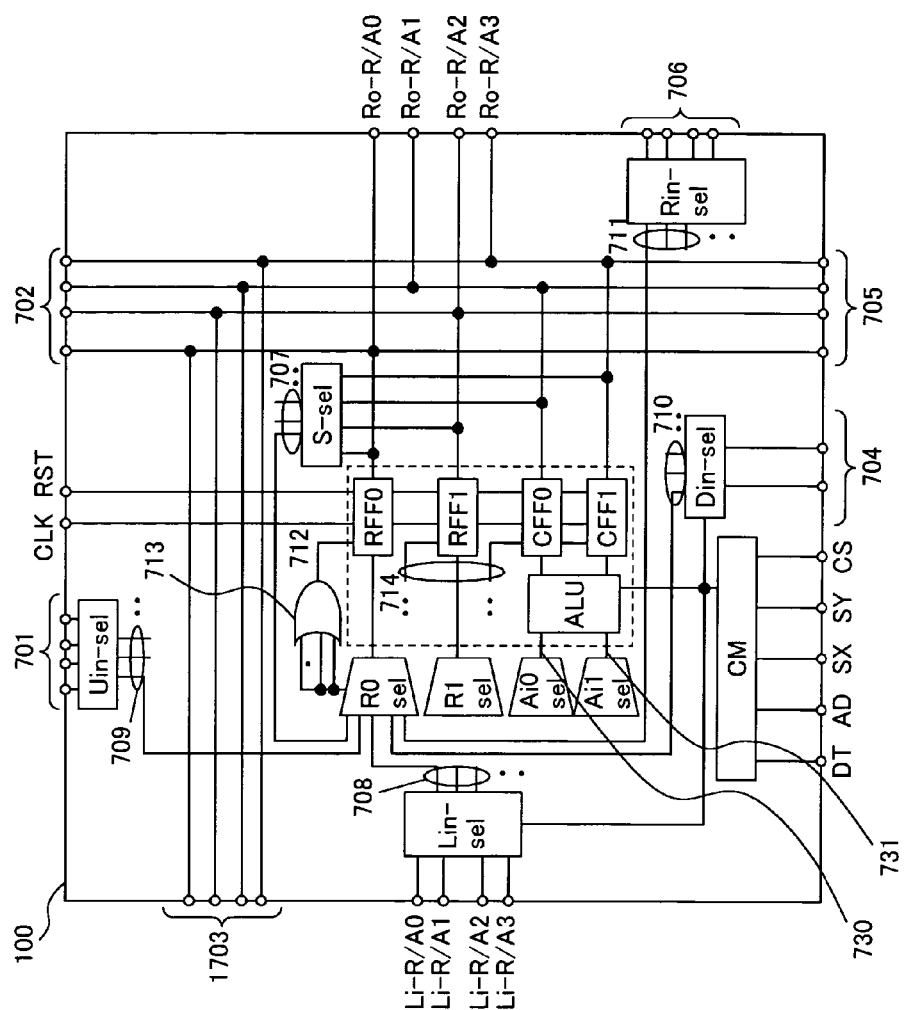
FIG. 21 is a circuit diagram mainly showing the cell internal placement of the basic cells in FIG. 20.

FIG. 20 and FIG. 21 are diagrams of other embodiments of the basic cell 100 in FIG. 2. FIG. 20 is a diagram showing an outline of another embodiment of the basic cells 100 in FIG. 2. Here, the points which differ from FIG. 2 are that the output switch OSW is eliminated, and data to be input to the data-transfer flip-flops RFF0, RFF1 or the arithmetic logic circuit ALU is selected from among 16 inputs. In other words, a look at the basic cell shows that the output side switch OSW has been eliminated and that the functions of the output side switch can be incorporated into the input side switch ISW. FIG. 21 is a diagram clearly showing the data input source and data output destination for the basic cell of FIG. 20. In this embodiment, as described above, the output side selector has been eliminated and the outputs to the upper, lower, left, right basic cell are issued directly from the data-transfer flip-flops RFF0, RFF1 and the result storage flip-flops CFF0, CFF1. Therefore, there is an increased number of terminals.

2. Second Embodiment

A second embodiment will be described. Compared to the first embodiment, the second embodiment is characterized in that a through-path is attached in the cell. Here, a through-path means a data transfer path through the cell without the intervention of a flip-flop (storage circuits).

FIG. 22 is a table showing the differences between the first embodiment, the second embodiment and the related art. In FIG. 22, an arithmetic calculation is indicated by "Op." and a data transfer is indicated by "DTr.". In this figure, five arithmetic (logic) circuits from ALU1 through ALU5 are arrayed in series, and it is assumed that calculation is performed in the ALU1, then calculated data is transferred to the ALU5, and calculation is performed using the transferred data in ALU5. Therefore, the position becomes farther away from the ALU1 as the figures grows larger. The related art does not have flip-flops such as shown in the first embodiment in the arithmetic calculation circuits, so that the arithmetic calculation in ALU1 and the data transfer through ALU5 must be performed in one cycle. In contrast, in the first embodiment, each cell contains at least a one cycle operation flip-flop, so that three cycles are required after calculation in the ALU1 for transferring data from ALU2 through ALU4. The second embodiment focuses on the fact that the required time to perform only a data transfer is shorter than that to perform only an arithmetic calculation. And then, by using a through-path, the data transfer from ALU2 through ALU4 can be performed in one cycle. In comparing these three technologies, the related art technology was unable to shorten the one clock cycle time required for data transfer and arithmetic calculation. In contrast, the first embodiment is capable of operating at least only in the time required for calculation within one clock cycle. The first embodiment therefore has a higher operating frequency than the related art. Further, the second embodiment is capable of transferring data to arithmetic logic circuits that are farther away but at the same frequency as the first embodiment. Therefore, compared to the first embodiment, the second embodiment has a reduced latency, and it has lower power consumption due to a reduced number of dynamic latches.

Figure 23:
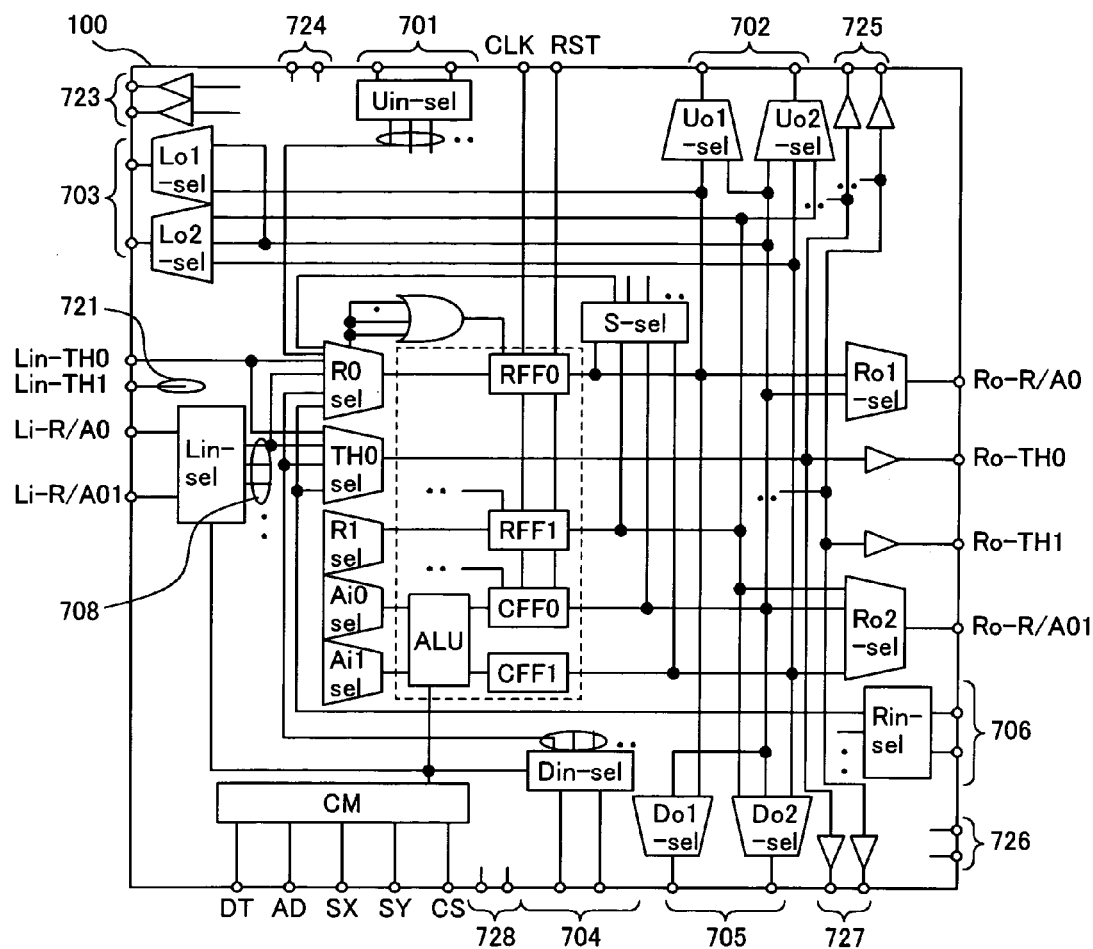
FIG. 23 is circuit diagram showing a basic cell with a through path in the second embodiment of the present invention.

FIG. 23 is a diagram showing the basic structure of the cell formed with the through-path in the second embodiment. Compared to FIG. 19, the basic cell shown in FIG. 23 has through-path input terminals Lin-Th0, Lin-TH1, output terminals Ro-TH0, Ro-TH1, and through-path selectors TH0sel, TH1sel. To avoid complexity, the selector TH1sel is omitted from the drawing. Here, paths for transferring data input from Lin-Th0, comprise two kinds of path. One is a path by way of selector TH0sel for continuing the through-path. Another is a path by way of the selector R0sel to terminate the through-path and to store data into the RFFO. The last path does not comprise the arithmetic logic circuit ALU to avoid the situation that data transfer and arithmetic calculation must be performed within one cycle. This situation leads to a lowering of the operating frequency.

The selectors TH0sel, TH1 sel are used when the data of flip-flops RFF0, RFF1, or the result storage flip-flops CFF0, CFF1 are transferred by a through-path. In other words, data stored in flip-flop circuits in adjacent cells, or data in a feedback-loop, can be transferred through the through-path using the selectors TH0sel, TH1 sel.

The selector TH0sel selects one from among data from Lin-TH0, as well as each selector Lin-sel, Uin-sel, Rin-sel, Din-sel, S-sel, and sends the data to the output terminal Ro-TH0. Unlike the first embodiment, by forming a path in this way not using flip-flops, data can be transferred to non-adjacent basic cells in one clock cycle. The selector Th1se1, not shown in the drawing, also has identical functions.

Figure 24:
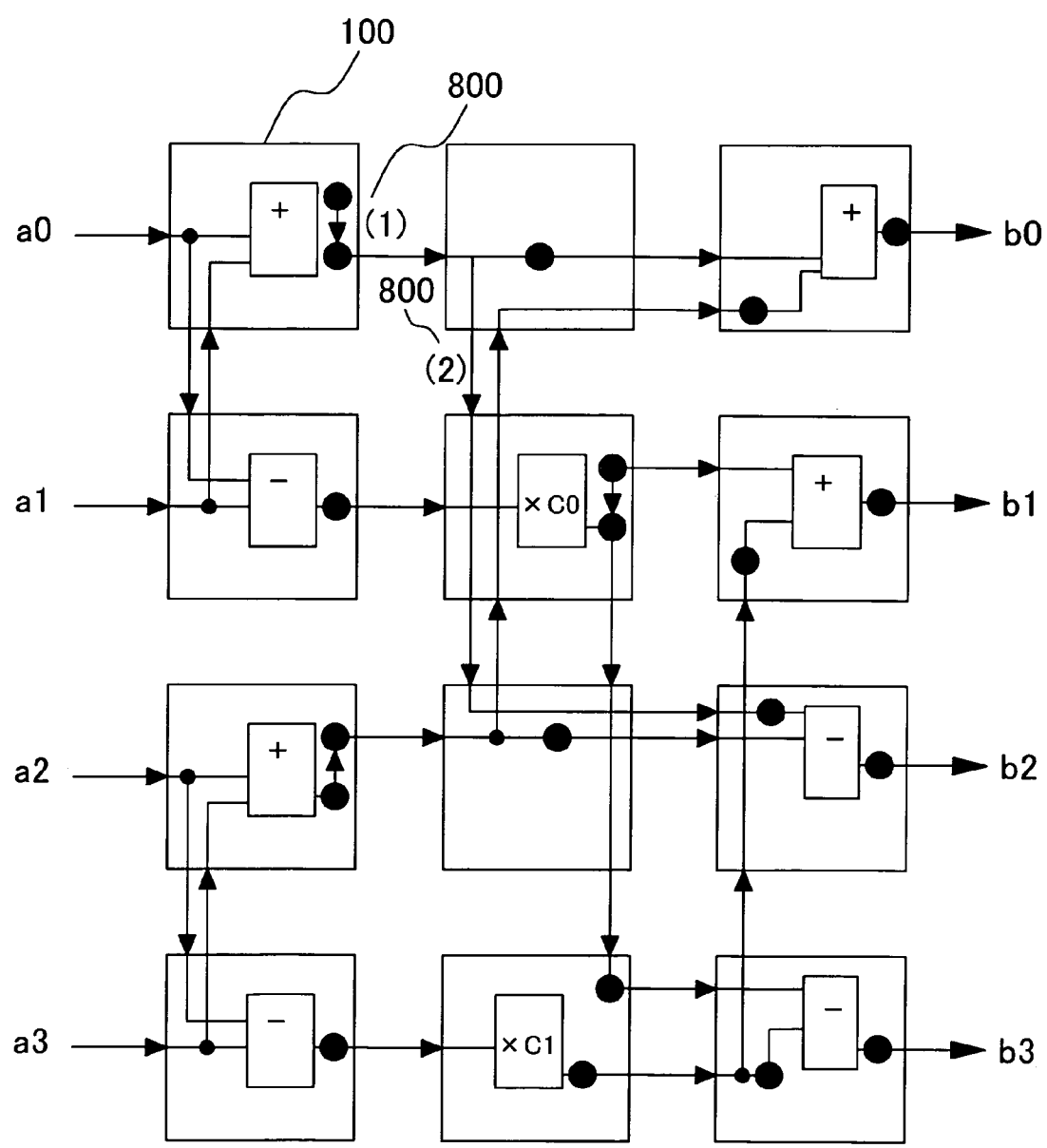
FIG. 24 is a wiring diagram showing the mapping of fast Fourier transforms utilizing the basic cell of FIG. 23.

FIG. 24 is a diagram showing mapping of a portion of the fast Fourier transform of FIG. 15 according to the cells of FIG. 23. The reference (1) of 800 in FIG. 24 indicates just one loop within the cell utilizing the feedback-loop. The path labeled (2) is a path utilizing the through-path. The latency, the number of cells, and the number of dynamic latches that cost power consumption have all been decreased compared to the arrangement of FIG. 15. The latency has been reduced from 7 cycles to 4 cycles, and the number of cells was reduced from 16 to 12, and the number of dynamic latches has been reduced from 40 to 20, by reducing the number of data transfer cells. As initially described, the invention is superior to the related art in the point that the above described effects are achieved without lowering the frequency.

Figure 25:
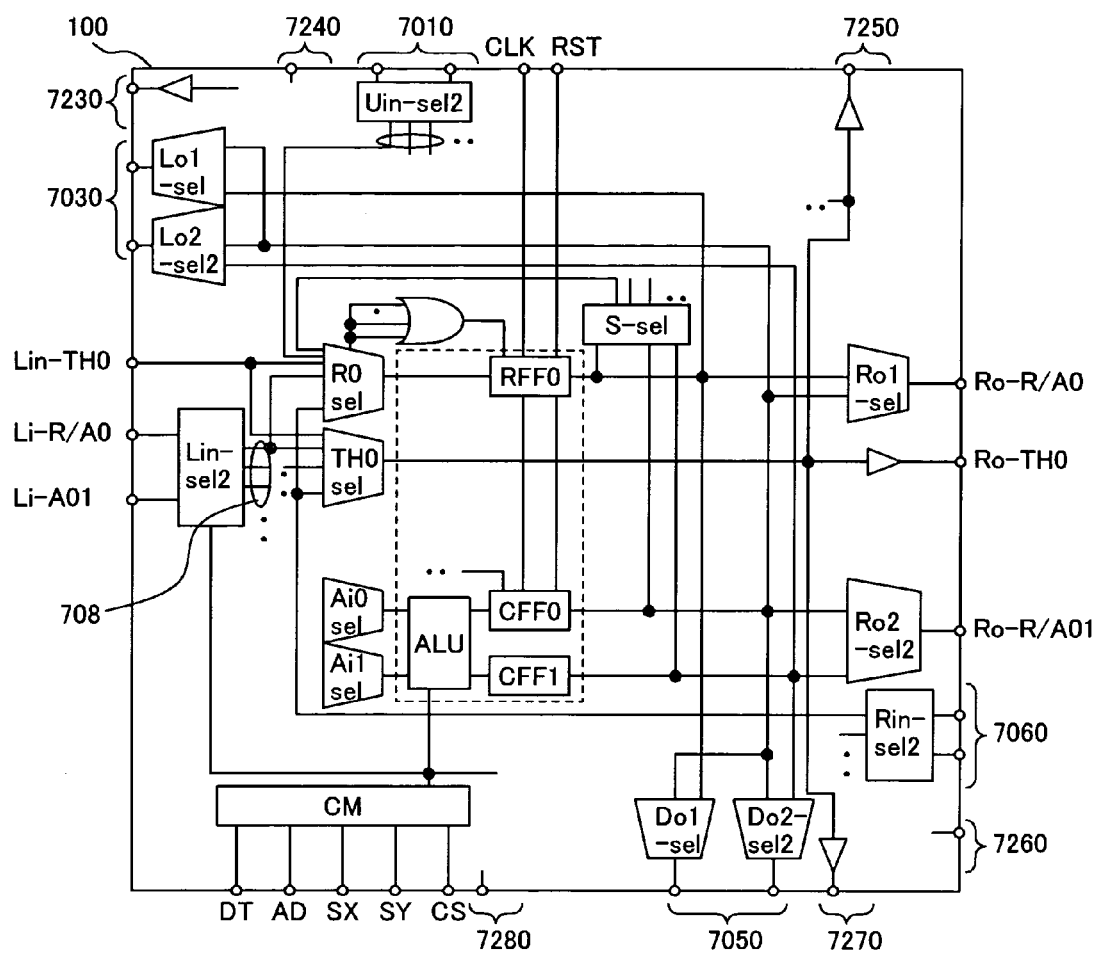
FIG. 25 is a circuit diagram with the number of through path terminals from the basic cell of FIG. 23 reduced and the through paths limited to data transfer only in the upward direction.

However, forming a through-path increases the number of input/output terminals and selectors and the wiring limitations become more restrictive. In FIG. 25, the data transfer flip-flops and through-paths were formed as one path each to reduce these wiring restrictions and to allow elimination of the selectors TH1sel, R1sel, Ro1-sel, Lo1-sel, Uo1-sel, Do1-sel and the data transfer flip-flop RFF1 of FIG. 23. Furthermore, the transfer of data in one direction (here as the upward direction) is only by way of the through-path. Using only one (first) direction allows elimination of the upper-side output selector Uo1-sel, Up2-sel and the lower input selector Din-sel in FIG. 23. Usually, data is transferred in one direction (for example from top to bottom, or from left to right), and the reverse direction in most cases, it spans multiple cells without calculation, such as for feedback loops as through-paths, that is an empirical rule, so that this established restriction is settled. In other words, when basic cells are formed in a matrix as shown in FIG. 1, with specified calculations assigned to each basic cell, when the data flows in one direction, the reverse flow directions use only through-paths since data transfer in many cases skips over the basic cells assigned to specific calculations, and, therefore, other selectors can be eliminated. Each of the selectors contained in FIG. 25 has a reduced number of input signal lines compared to the selectors shown in FIG. 23 and, needless to say, therefore, can have fewer selectors than shown in FIG. 23. Though there are more restrictions on mapping the logic calculations, the circuit scale can be reduced. Since these restrictions are also established according to a rule of thumb (experience), when, for example, mapping a portion of the fast Fourier transforms, the drawing of the mapping will be the same as that shown in FIG. 24, and the circuit scale can be reduced regardless of the above restrictions.

FIG. 26 through FIG. 30 are embodiments with even greater reduction in the logic circuit scale and the number of terminals.

Figure 26:
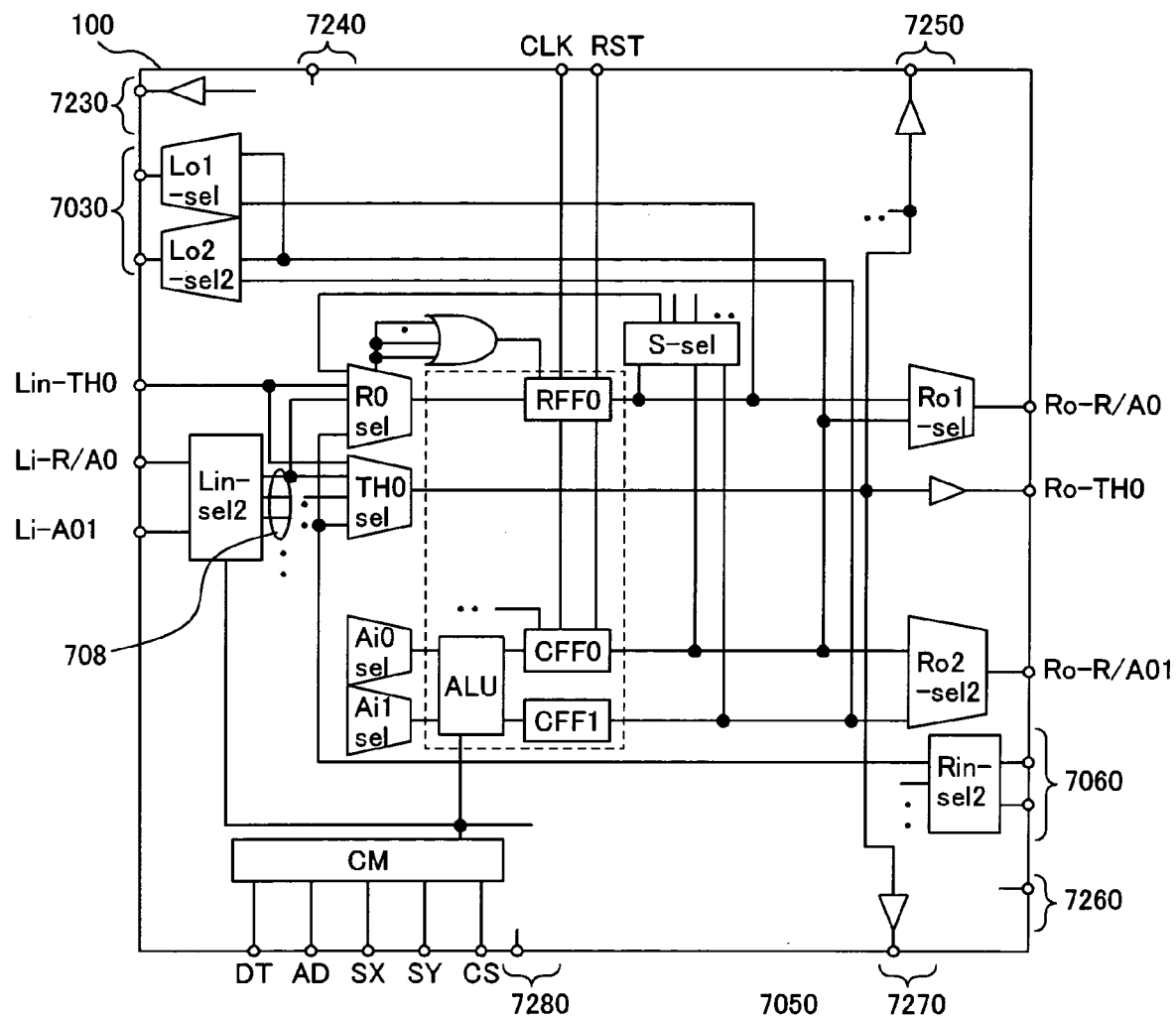
FIG. 26 is a circuit diagram with the through paths limited to transfer of data only in the downward direction from the basic cell of FIG. 25.

FIG. 26 is a diagram with data transfer using only through-paths not only in one (first) direction (upward direction in FIG. 23) but also in the second direction (here, the lower direction). The logic flow is generally from upper to lower and from left to right. However, the majority of paths are from left to right, and the flow from upper to lower for the calculation flow in one module is generally used for exchanging data between modules based on the rule of thumb. Using this type of structure allows good cell symmetry compared with FIG. 25, and easily creates a good development environment for compilers, mappers and DA, etc. Mappers are a type of DA that create configuration information for contriving basic cell functions (ALU functions) and data paths. In the structure in FIG. 26, the upward direction input side selector Uin-sel12, and the lower direction output side selectors Do1-sel and Do2-se12 of FIG. 25 are eliminated and there are fewer wiring restrictions. Though this type of structure has less freedom in terms of mapping, basically, the logic flow from left to right for fast Fourier transforms is the same mapping as in FIG. 26.

Figure 27:
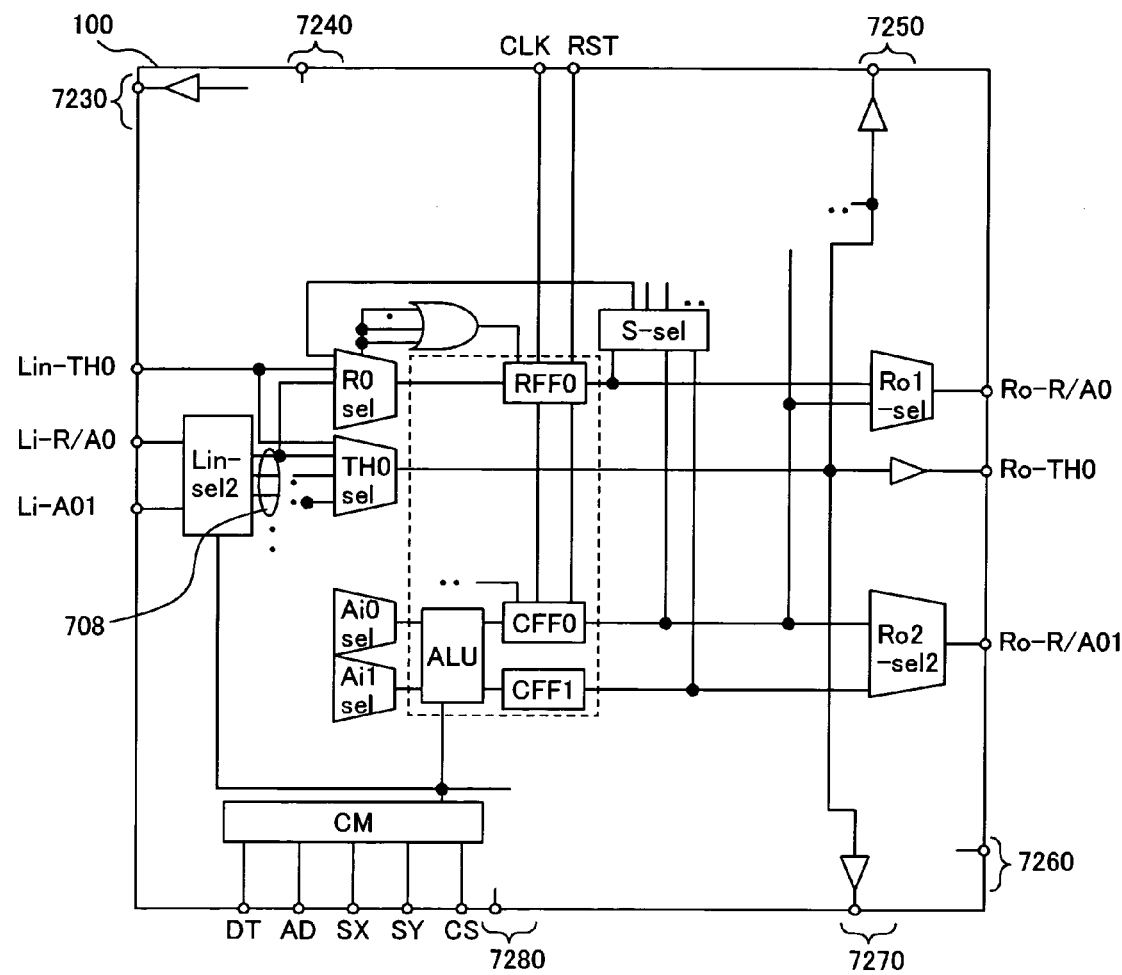
FIG. 27 is a circuit diagram with the through paths limited to transfer of data only in the leftward direction from the basic cell of FIG. 26.

FIG. 27 is a diagram where, compared to FIG. 26, data transfer is further carried out only by through-paths in the third direction (here, the left direction). In this patent, the flow of data is preferably left/right symmetrical assuming the block diagram of FIG. 1. However, a data flow from left to right may have priority according to the usage method. The restriction to only through-paths in the left direction was therefore established for the same reasons as in the upward direction restriction in FIG. 26.

Figure 28:
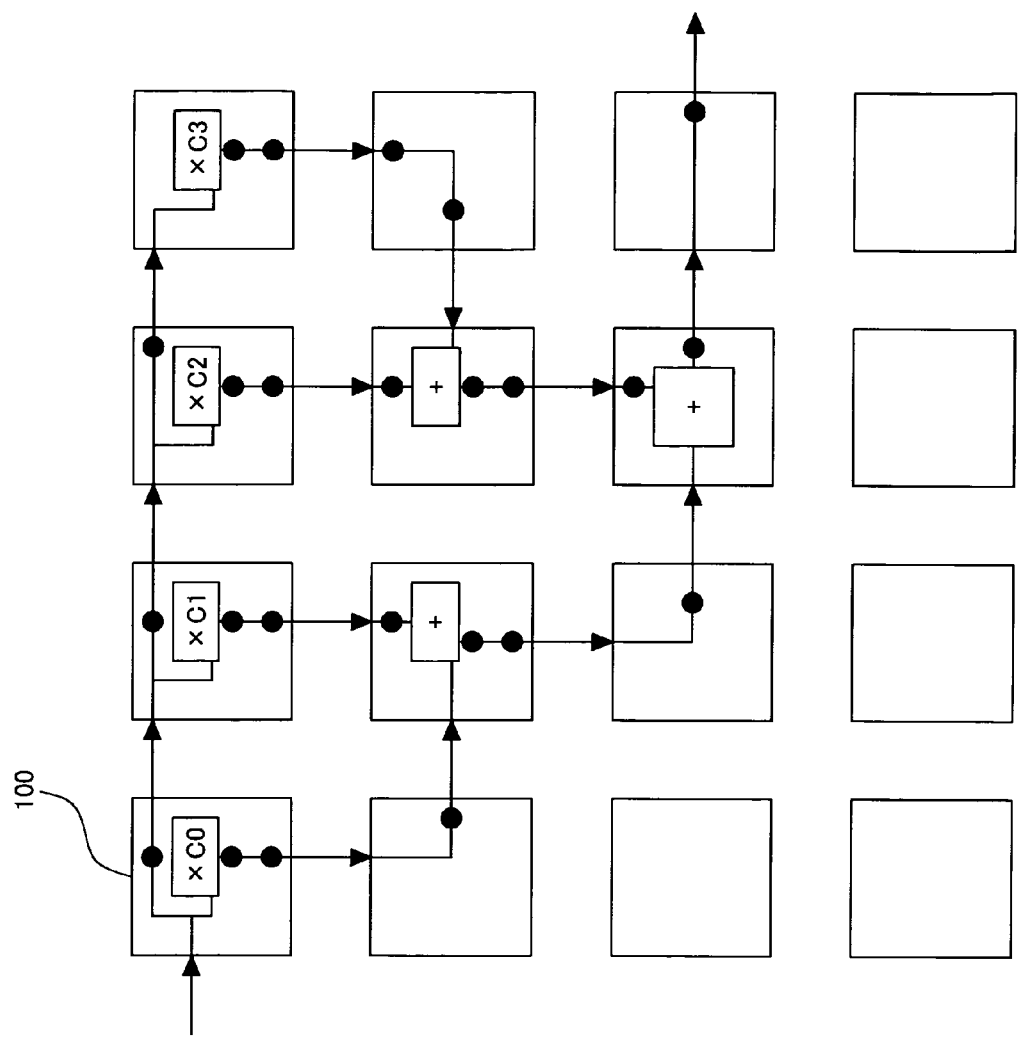
FIG. 28 is a diagram showing mapping with filter processing using the basic cell of FIG. 27.

Making the data transfer only by way of through-paths in the left direction exerts no particular change on the fast Fourier transform mapping, and so mapping was performed based on the filtering processing in FIG. 17. The results are shown in FIG. 28. Other than the number of cells, the same results as in the fast Fourier transform were obtained, and there were no effects from the leftward direction restriction.

Figure 29:
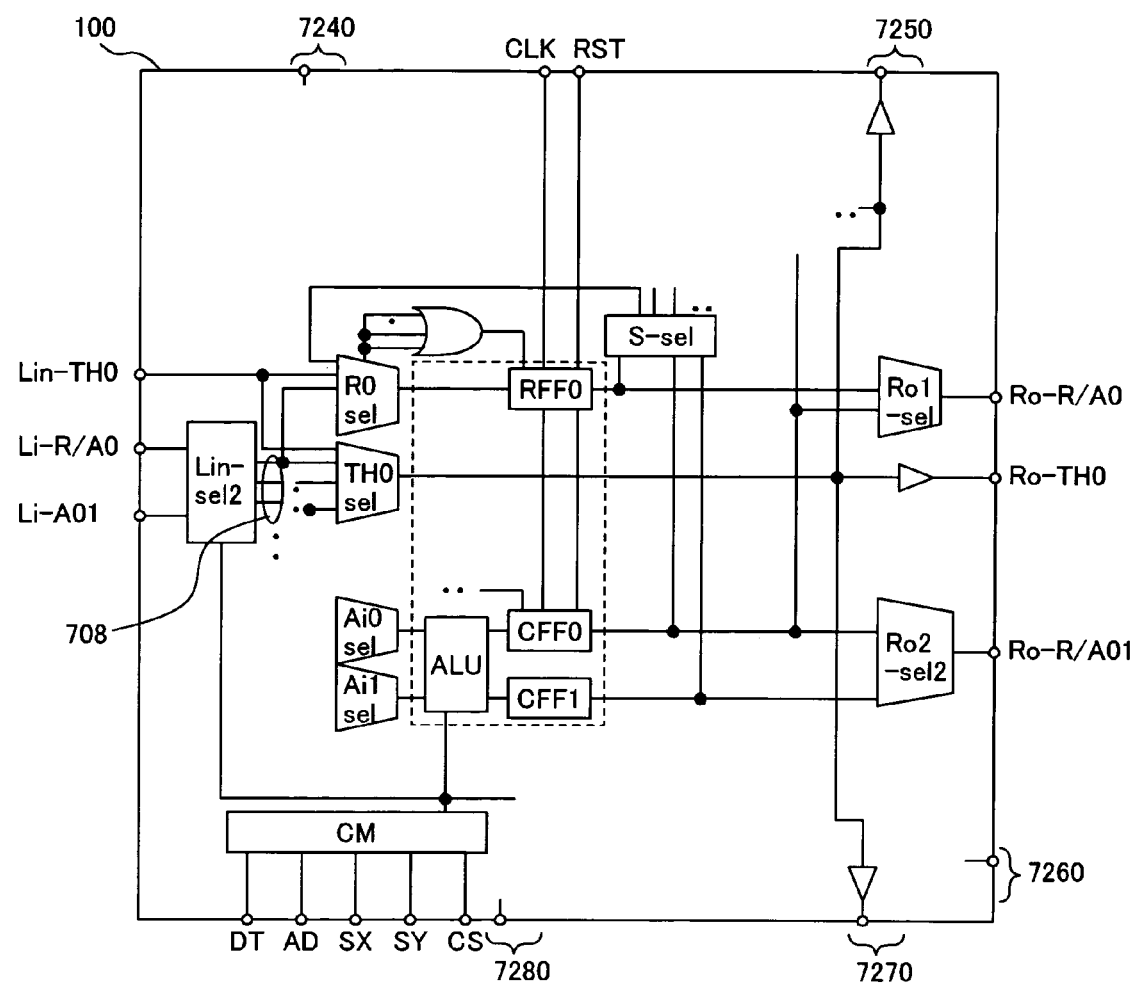
FIG. 29 is a circuit diagram showing discarding of the transfer of data in the leftward direction from the basic cell of FIG. 27.
Figure 30:
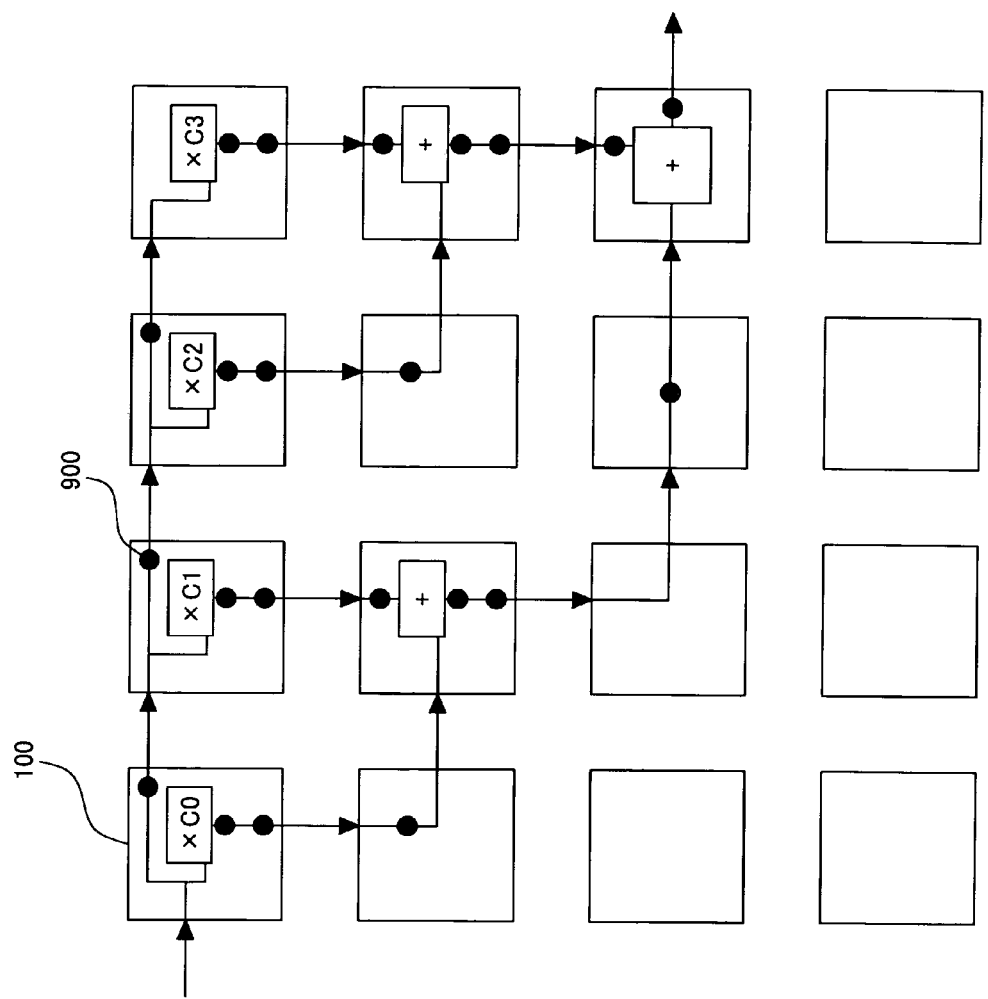
FIG. 30 is a diagram showing the mapping of filter processing using the basic cell of FIG. 29.

In the example shown in FIG. 29, all leftward data transfer is eliminated. All data flow is from left to right, so that when viewed from a vertical direction, multiple arithmetic logic circuits are operating in parallel. In other words, the circuits are parallel arithmetic logic circuits with through-paths only. Utilizing these cells yields the filtering mapping results of FIG. 30. Since data cannot be transferred to the leftward direction, the cell with the longest time delay (in FIG. 28, the farthest right is +) is formed farthest to the right.

3. Structure of System Devices

Figure 31:
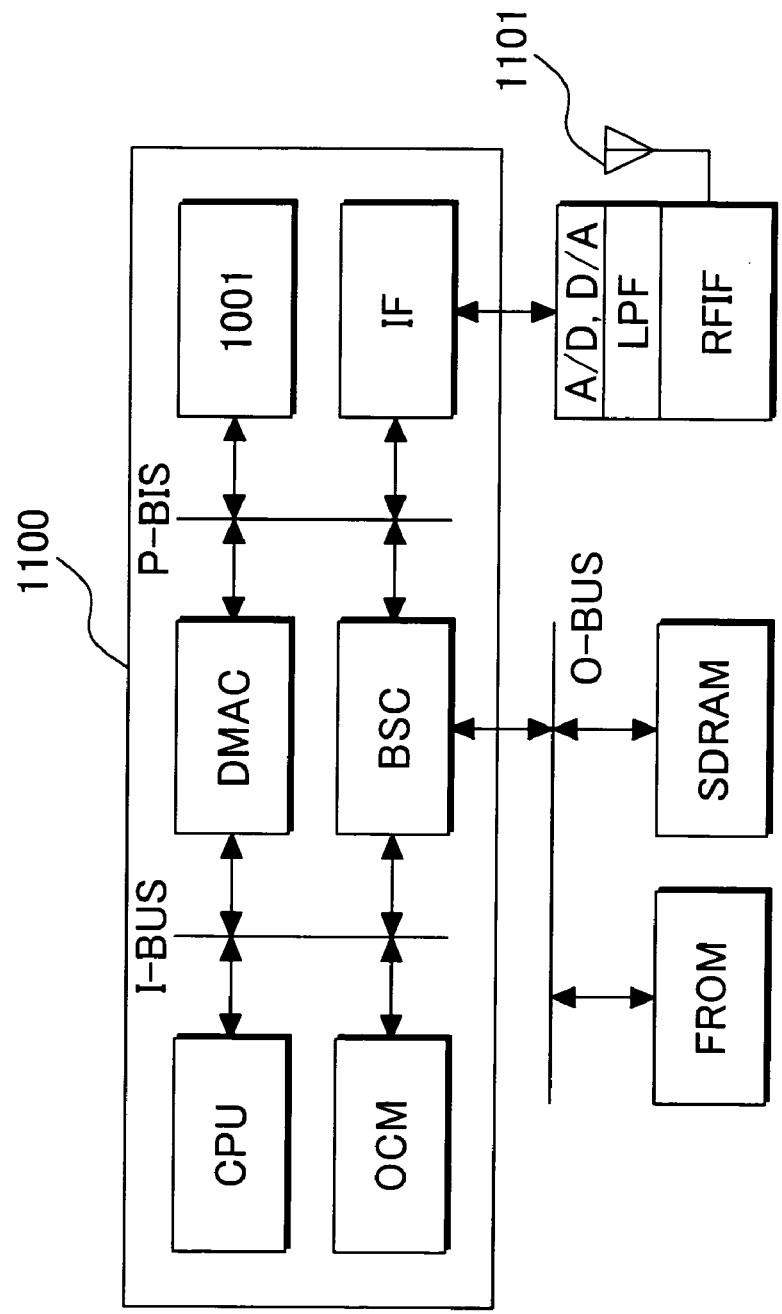
FIG. 31 is a block diagram showing the structure of the software-defined radio terminal using the chip containing the semiconductor integrated circuit of FIG. 1.

FIG. 31 is a block diagram of the structure of a software-defined radio terminal using the chip 1100 internally containing the IP1001 housing a cell array circuit that is capable of dynamic changes in configuration information according to the present invention.

The chip 1100 is comprised of a processor CPU, and an on-chip memory OCM, a direct memory access controller DMAC, a bus controller BSC, an IP1001 capable of dynamic changes in the configuration information, a chip external interface IF, an processor bus I-BUS, and a peripheral bus P-BUS. The external section of the chip is comprised of a flash (read-only memory) FROM, an SDRAM, an external bus O-BUS, an antenna 1101, an antenna interface RFIF, an analog low-pass filter LPF, an analog/digital converter A/D, and a digital/analog converter D/A. The flash FROM and the SDRAM are connected to the external bus O-BUS. The analog/digital converter A/D and the digital/analog converter D/A are connected to the external interface IF.

In this structure, the program for the processor CPU and the IP1001 is stored in the flash FROM or in the SDRAM. The IP1001 runs the baseband processing for the software-defined radio, and it stores the results in the on-chip memory OCM. The processor CPU runs the application by utilizing the data that has been stored in the on-chip memory OCM and converted by the IP1001.

The radio waves obtained by the antenna 1101 are then input through the antenna interface RFIF, and, after being processed in the analog low-pass filter LPF, they are converted to digital data in the analog/digital converter A/D and then input to the chip 1100 by way of the external interface IF. The data input to the chip external interface IF is then transferred to the IP1001 by the dynamic memory access controller DMAC.

The IP1001 uses the flash memory FROM or a SDRAM to load the control program and the configuration specified beforehand by the processor CPU, and it executes baseband processing. The baseband processed data is periodically transferred to the on-chip memory OCM by way of the dynamic memory access controller DMAC. The processor periodically searches the on-chip memory OCM and executes the application.

The software defined radio system is capable of use with different wireless systems by changing the control program and the configuration information loaded in the IP1001 so there is no need to install dedicated circuits for each wireless (radio) system. The size (surface area) of the chip can therefore be reduced. The structure of this software defined radio system is capable of use with new wireless (radio) systems by rewriting the configuration information and improving the processing method. This structure can further be used as an accelerator when not carrying out wireless communications, by utilizing the configuration information for the application executed by the processor CPU.

When designing system LSI devices, such as shown in FIG. 31, the design work can be simplified by preparing the structure shown in FIG. 1 ahead of time as the IP.

In the structure of the present invention, the configuration information is not dependent on the frequency because a fixed wire length is used, and the wiring between cells is all adjacent wiring. There is therefore no need to also change the frequency when the configuration information has been changed. Further, highly efficient use can be made of the arithmetic circuits compared to the case when utilizing configuration information using only adjacent wiring in cell arrays that do not contain data transfer flip-flops, and, therefore, the desired function can be implemented with a low number of cells. When running an application on a two-dimensional cell array using the basic cells of the present invention, pipeline processing can be used for not only arithmetic calculation, but also for communication, so that even though the latency is more delayed, a high throughput can be maintained, so that even applications with a large capacity data flow can be processed at high speed.

The present invention is applicable to semiconductor integrated circuits and is particularly effective for dynamically reconfigurable LSI devices.

What is claimed is:

1. A semiconductor integrated circuit comprising:
   cell arrays comprised of multiple basic cells formed in arrays, wherein each of the basic cells comprises:
      an input switch connected to input lines that receive input data only from immediately adjacent upper/lower/right/left basic cells;
   a first data path including a first data holding circuit and an arithmetic logic circuit between the input switch and output lines that output data only to the immediately adjacent upper/lower/right/left basic cells;
   a second data path including a second data holding circuit between the input switch and the output lines; and
   a configuration memory
   wherein the input lines and the output lines are each connected only to the immediately adjacent upper/lower/right/left basic cells;
   wherein the configuration memory is adapted to store input switch selection information and arithmetic logic circuit function information;
   wherein the input switch is adapted to select the input data specified by the input switch selection information from among the input lines;
   wherein the arithmetic logic circuit is adapted to perform calculations on the input data as specified by the arithmetic logic circuit function information;
   wherein the first data holding circuit is adapted to store calculated result data from the arithmetic logic circuit, and the second data holding circuit is adapted to hold data input from the input lines,
   wherein each of the basic cells is adapted to perform an arithmetic calculation by using the first path and to simultaneously transfer data by using the second path in parallel, and
   wherein the input switch is adapted to select the input data sent from any of the immediately adjacent upper basic cell, lower basic cell, left basic cell and right basic cell, and to output the selected input data to any of the first data path and the second data path,
   wherein the configuration memory comprises a configuration selector, a first configuration memory device and a second configuration memory device;
   wherein each of the first configuration memory device and a second configuration memory device is adapted to store the input switch selection information and the arithmetic logic circuit function information,
   wherein the configuration selector is adapted to output the input switch selection information and the arithmetic logic circuit function information stored in one of the first configuration memory device and the second configuration memory device into the input switch and the arithmetic logic circuit according to an instruction on a configuration select signal line, and
   wherein the input switch selection information and the arithmetic logic circuit function information stored in the unselected one of the first and second configuration memory devices are rewritten while the configuration selector outputs the input switch selection information and the arithmetic logic circuit function information stored in the selected one of the first and second configuration memories.

2. A semiconductor integrated circuit according to claim 1, wherein the arithmetic logic circuit includes a first arithmetic circuit, and a second arithmetic circuit for performing calculations different from the first arithmetic circuit, and the arithmetic logic circuit is adapted to utilize first arithmetic function information to decide whether to perform arithmetic calculations using the first arithmetic circuit or perform calculations using the second arithmetic circuit.

3. A semiconductor integrated circuit according to claim 1, wherein either one of the first configuration memory device and a second configuration memory device, which is selected by the configuration select signal line, does allow rewriting.

4. A semiconductor integrated circuit according to claim 3, wherein the configuration memory further comprises an address decoder, an address signal line and a data line;

wherein the address decoder is adapted to decode addresses on the address line; and wherein the input switch selection information and the arithmetic logic circuit function information in either one of the first configuration memory device and the second configuration memory device, which matches the address, are rewritten by data input from the data line.

5. A semiconductor integrated circuit according to claim 1, further comprising a controller adapted to control writing of the input switch selection information, on the configuration memory contained in each of the multiple basic cells.

6. A semiconductor integrated circuit according to claim 1, further comprising a data memory adapted to store data for processing, wherein the data stored in the data memory is input to the cell arrays.

7. A semiconductor integrated circuit according to claim 1, wherein each cell further comprises:

a third data path between the input switch and the output lines, wherein the third data path is adapted to transfer data input from the input lines into the output lines.

8. A semiconductor integrated device according to claim 1, further comprising:

a third data path connected between an input of the input switch and an output of the first data holding circuit; and a fourth data path connected between the input of the input switch and an output of the second data holding circuit, wherein the input switch is adapted to select the input data sent from any of the immediately adjacent upper basic cell, the lower basic cell, left basic cell and right basic cell and the third and the fourth paths, and to output the selected input data to any of the first data path and the second data path.

* * * * *